US012702060B2

(12) United States Patent
Chen et al.

(10) Patent No.: US 12,702,060 B2
(45) Date of Patent: Aug. 4, 2026

(54) PACKAGE AND METHOD FOR FORMING THE SAME

(71) Applicant: Taiwan Semiconductor Manufacturing Co., Ltd., Hsinchu (TW)

(72) Inventors: Hsien-Wei Chen, Hsinchu (TW); Meng-Liang Lin, Hsinchu (TW); Shin-Puu Jeng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 1046 days.

(21) Appl. No.: 17/830,187

(22) Filed: Jun. 1, 2022

(65) Prior Publication Data

US 2023/0395581 A1 Dec. 7, 2023

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 70/05* (2026.01); *H10W 70/095* (2026.01); *H10W 70/65* (2026.01); *H10W 70/685* (2026.01); *H10W 90/401* (2026.01); *H10W 74/00* (2026.01);
(Continued)

(58) Field of Classification Search
CPC ......... H01L 24/18; H01L 24/19; H01L 24/20; H01L 23/5389; H01L 23/3121; H01L 23/3142; H01L 23/313; H01L 23/25; H01L 23/36; H01L 2924/18301; H01L 2924/15153; H01L 2224/92244; H01L 2224/73267; H01L 74/127; H05K 1/0204; H10W 70/611; H10W 90/401; H10W 70/614; H10W 90/701; H10W 70/09
See application file for complete search history.

(56) References Cited

U.S. PATENT DOCUMENTS 10,985,127 B2 4/2021 Lee
2019/0164862 A1* 5/2019 Kim .................... H01L 23/3142
(Continued)

FOREIGN PATENT DOCUMENTS

TW 201919181 A 5/2019
TW 201926593 A 7/2019

*Primary Examiner* — Alia Sabur
(74) *Attorney, Agent, or Firm* — Slater Matsil, LLP

(57) ABSTRACT

A package is provided in accordance with some embodiments. The package includes a substrate including a first conductive via embedded in a first substrate core; a conductive pattern disposed on the first substrate core, wherein the conductive pattern includes a first conductive pad and a second conductive pad; a second substrate core disposed on the first substrate core and the conductive pattern; and a second conductive via disposed in the second substrate core and on the second conductive pad. The package also includes an encapsulant embedded in the second substrate core and in physical contact with the first conductive pad; a first die, including die connectors, embedded in the encapsulant and disposed on the first conductive pad; a redistribution structure disposed on the second conductive via, the die connectors and the encapsulant; and a second die disposed on the redistribution structure.

20 Claims, 22 Drawing Sheets

100

(51) Int. Cl.
| | | |
|---|---|---|
| *H10W 70/05* | (2026.01) | |
| *H10W 70/65* | (2026.01) | |
| *H10W 70/685* | (2026.01) | |
| *H10W 74/00* | (2026.01) | |
| *H10W 74/01* | (2026.01) | |
| *H10W 74/15* | (2026.01) | |

(52) U.S. Cl.
   CPC .......... *H10W 74/016* (2026.01); *H10W 74/15* (2026.01); *H10W 90/701* (2026.01); *H10W 90/724* (2026.01); *H10W 90/734* (2026.01)

(56) References Cited

U.S. PATENT DOCUMENTS

| | | | |
|---|---|---|---|
| 2020/0075496 A1* | 3/2020 | Yu | H01L 24/05 |
| 2020/0273773 A1* | 8/2020 | Wan | H01L 21/568 |
| 2021/0125961 A1* | 4/2021 | Tsai | H01L 23/3128 |
| 2021/0193609 A1* | 6/2021 | Hwang | H01L 24/25 |
| 2021/0320068 A1 | 10/2021 | Leitgeb | |

* cited by examiner

PACKAGE AND METHOD FOR FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 4, 5A, 6 through 21 illustrate cross-sectional views of intermediate steps during a process for forming a package device in accordance with some embodiments.

DETAILED DESCRIPTION

Figure 1:
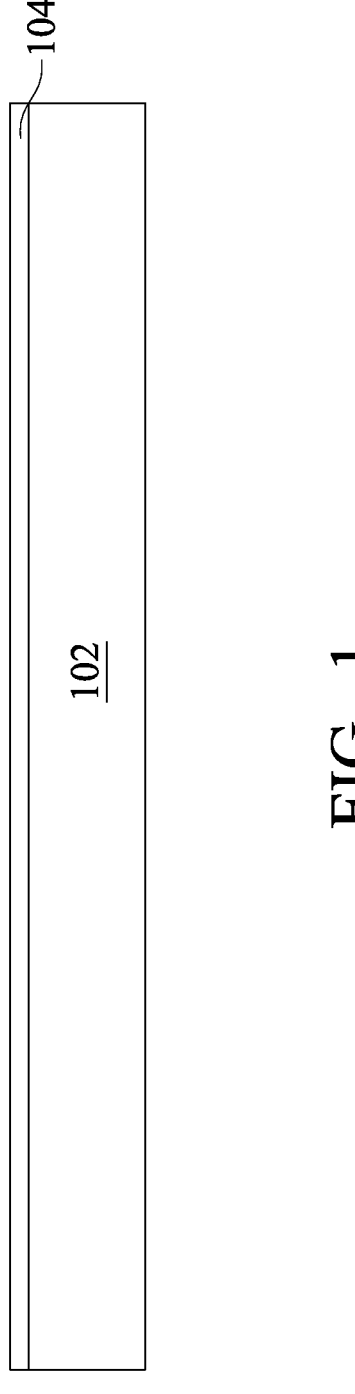

The following disclosure provides many different embodiments, or examples, for implementing different features of the invention. Specific examples of components and arrangements are described below to simplify the present disclosure. These are, of course, merely examples and are not intended to be limiting. For example, the formation of a first feature on or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a substrate with a cavity and the method of forming the same are provided in accordance with some embodiments. In accordance with some embodiments of the present disclosure, the substrate includes a conductive pad for being a stopper for forming the cavity in the substrate. Dies such as passive device dies may be disposed in the cavity and have top surfaces coplanar with the top surfaces of the conductive vias in the substrate. The coplanar top surfaces allow a redistribution structure directly formed thereon and bonded to the dies and the conductive vias. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 19 illustrate cross-sectional views of intermediate steps during a process for forming a first package device 100, in accordance with some embodiments. In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple first package devices 100 can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and then cured, or may be a laminate film laminated onto the carrier substrate 102, or the like. The top surface of the release layer 104 may be leveled.

Figure 2:
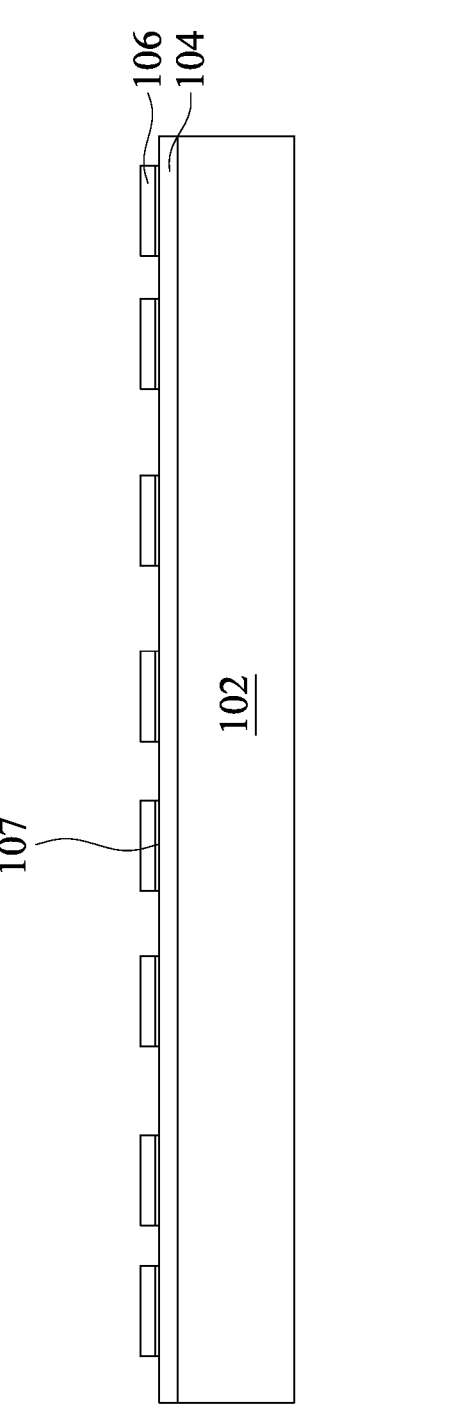

Referring to FIG. 2, a first conductive pattern 106 is formed on the release layer 104. The formation of the first conductive pattern 106 may include forming a seed layer 107 on the release layer 104; forming a patterned mask (not shown) such as a photoresist on the seed layer 107, and then performing a metal plating process on the exposed seed layer 107 to plate a metallic material. The patterned mask and the portions of the seed layer 107 covered by the patterned mask are then removed, leaving the first conductive pattern 106 as illustrated in FIG. 2. The patterned mask may be removed by an acceptable ashing or stripping process, such as using an oxygen plasma or the like. In accordance with some embodiments, the seed layer 107 includes a titanium layer and a copper layer on the titanium layer. The seed layer 107 may be formed using, for example, Physical Vapor Deposition (PVD). The plating may be performed using, for example, electrochemical plating. The plated metallic material may include a metal or a metal alloy, including copper, aluminum, tungsten, or the like. The first conductive pattern 106 may include metal pads for landing Under-bump Metallurgies (UBMs). The first conductive pattern 106 may also include metal traces for routing electrical signals, power, and/or ground lines although in some embodiments the first conductive pattern 106 has the metal pads only. In some embodiments, the metal pads of the first conductive pattern 106 have a shape such as a circular shape, an oval shape, a square shape, a rounded square shape, a rectangle shape, a rounded rectangle shape, a hexagon shape, a rounded hexagon shape, or a combination thereof, or the like.

Figure 3:
Figure 3:
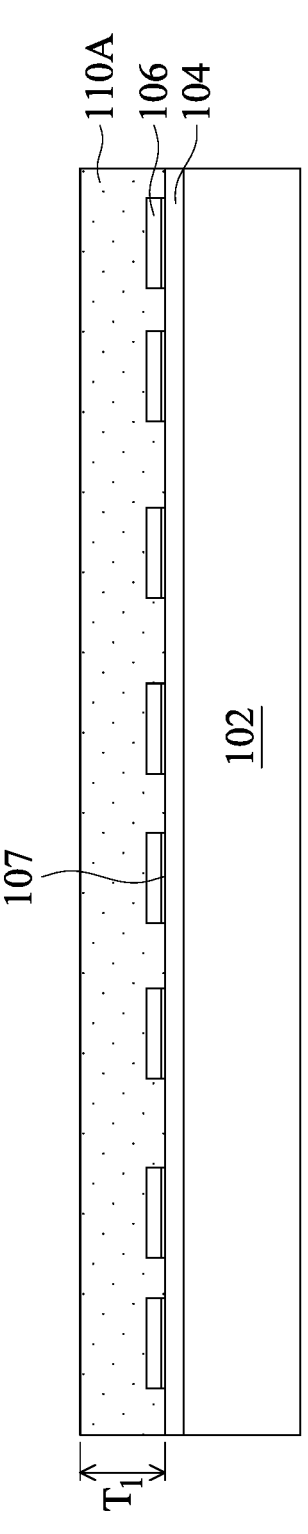

In FIG. 3, a first substrate core 110A is formed on the first conductive pattern 106 and the release layer 104. As will be discussed in greater detail below, the first substrate core 110A is a part of a substrate 110 (see e.g., FIG. 9) of the first package device 100. The first substrate core 110A may be formed from a pre-impregnated composite fiber ("prepreg"), a build-up insulating film, paper, glass fiber, non-woven glass fabric, silicon, or the like. In some embodiments, the first substrate core 110A is formed from a prepreg including glass fiber and a resin. In some embodiments, the first substrate core 110A is an epoxy-impregnated glass-cloth laminate, a polyimide-impregnated glass-cloth laminate, or the like. As an example to form the first substrate core 110A, a material of the first substrate core 110A in a liquid or semi-liquid form is disposed on the first conductive pattern 106 and the release layer 104 and then cured by a thermal lamination process. The thermal lamination process may include applying a pressure of 0.6 PSI to 10 PSI to the material of the first substrate core 110A with a temperature of 25° C. to 90° C. After the thermal lamination process, the first conductive pattern 106 is embedded in the first substrate core 110A and may have a bottom surface coplanar with a bottom surface of the first substrate core 110A. The first substrate core 110A may have a thickness $T_1$ between 10 μm and 30 μm such as 15 μm, though other thicknesses are contemplated and may be used.

Figure 4:
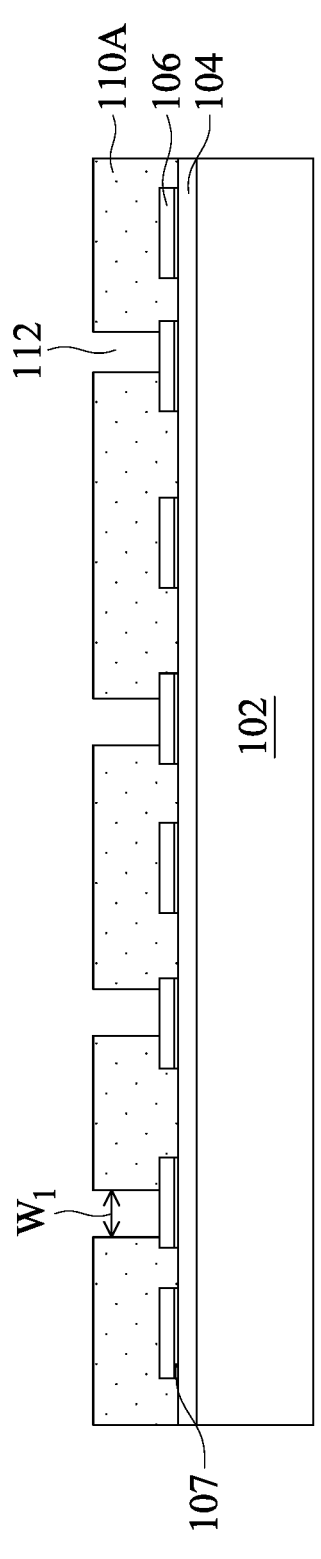

In FIG. 4, openings 112 are formed through the first substrate core 110A and expose the metal pads of the first conductive pattern 106 in accordance with some embodiments. The openings 112 may be formed by laser drilling. Other processes, such as mechanical drilling with a drill bit, may also be used to form the openings 112. Any other suitable process may be used for forming the openings 112. The openings 112 may have any top-view shape, such as a polygon, a circle, or the like. A cleaning process may then be performed to clean areas near the openings 112 which may have been smeared with removed material of the first substrate core 110A. Openings 112 may have a width W1 of 50 μm to 120 μm, such as 80 μm, though other values are contemplated and may be used. In some embodiments, openings 112 are formed in a regular pattern, having a pitch of 70 μm to 1000 μm, though other values are contemplated and may be used.

Figure 5A:
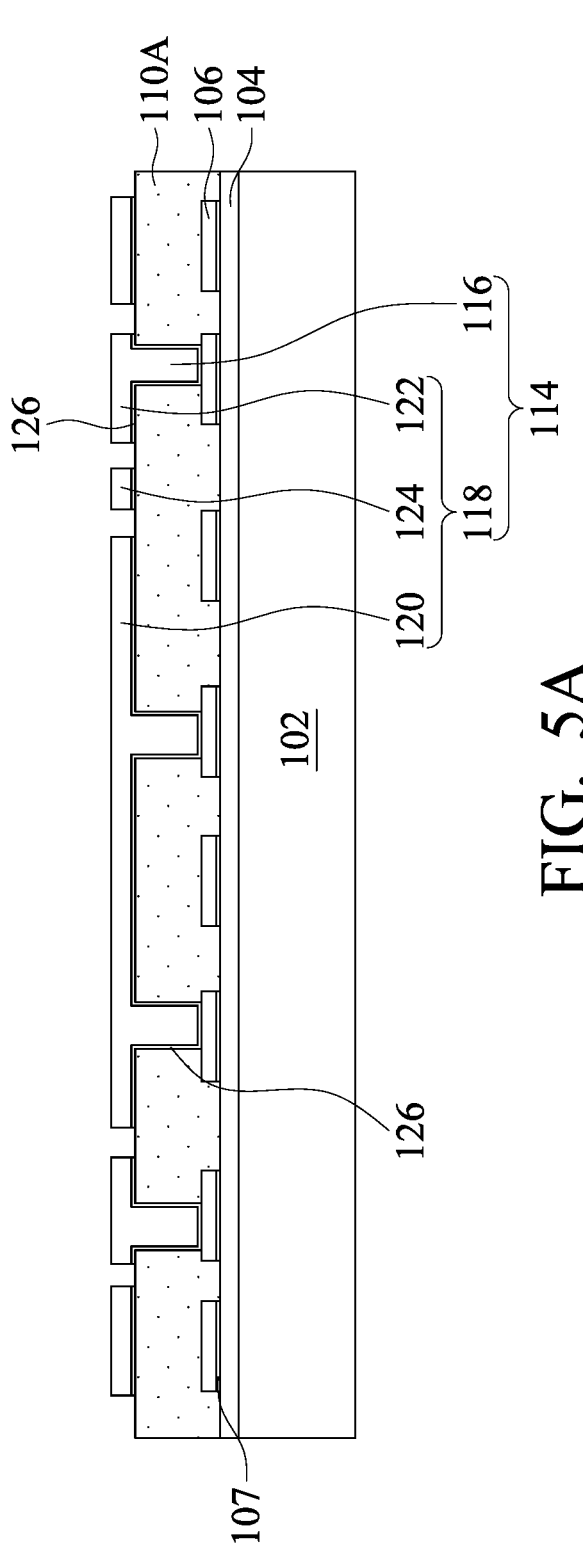

In FIG. 5A, a conductive layer 114 is formed in the openings 112 and on the top surface of the first substrate core 110A in accordance with some embodiments. The conductive layer 114 may include first conductive vias 116 and a second conductive pattern 118 formed on the first substrate core 110A and the first conductive vias 116. The first conductive vias 116 may be formed in the openings 112 and in physical contact with the first conductive pattern 106. The second conductive pattern 118 may include a first conductive pad 120 formed on the first substrate core 110A and second conductive pads 122 formed on the first substrate core 110A and the first conductive vias 116. The second conductive pattern 118 may also include conductive lines 124 formed on the first substrate core 110A and between the second conductive pads 122 and/or between the first conductive pad 120 and the second conductive pad 122 for transmitting electrical signals. In some embodiments, the conductive lines 124 are omitted for achieving fine pitches of the second conductive pads 122. In some embodiments, the first conductive pad 120 is disposed on and in physical contact with at least one of the first conductive vias 116 and electrically connected to power and/or ground lines. In some embodiments, no first conductive vias 116 are disposed below and connected to the first conductive pad 120, and the first conductive pad 120 is electrically isolated.

Figure 5B:
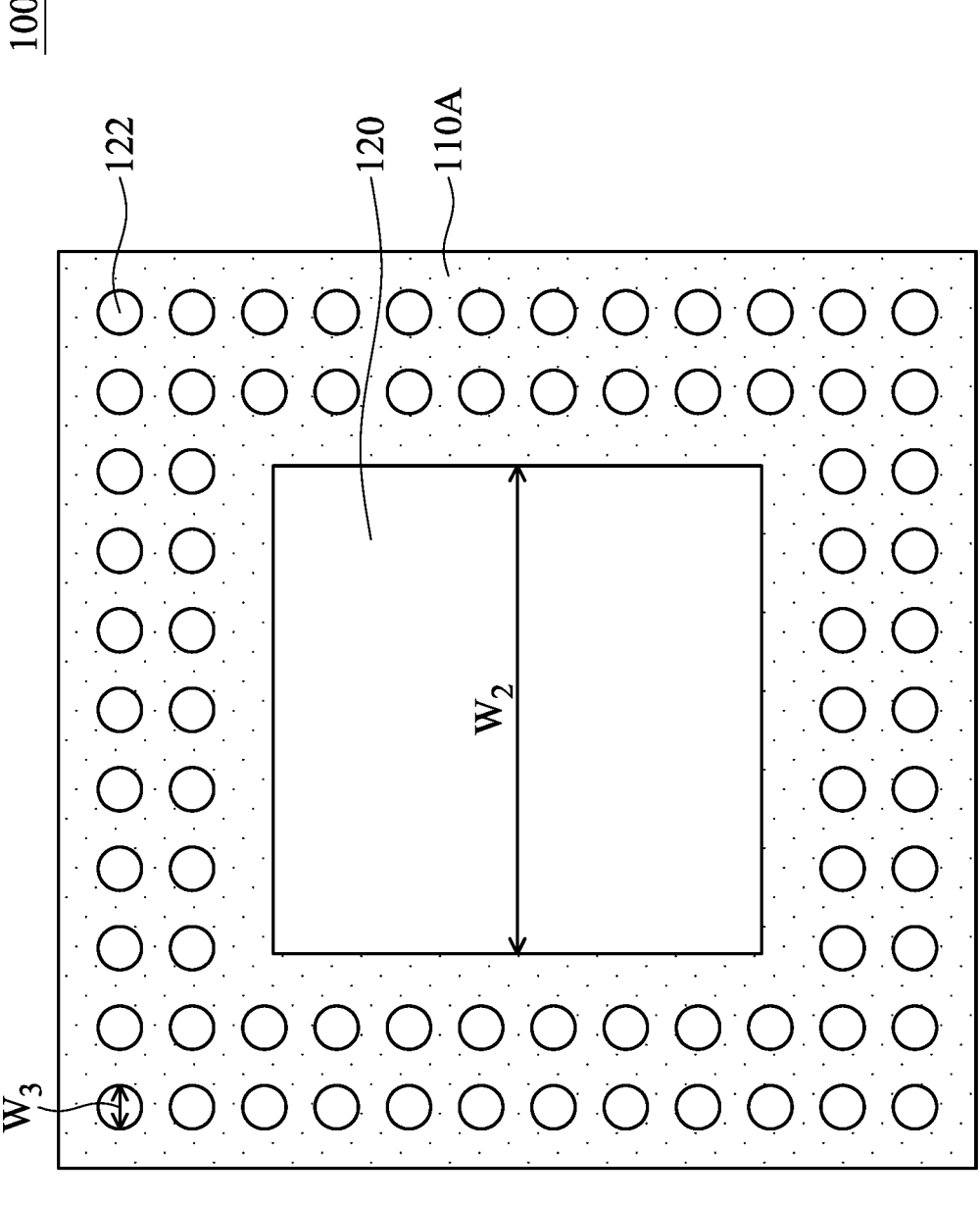
FIG. 5B illustrates a plan view of an intermediate step during a process for forming a package device in accordance with some embodiments.

FIG. 5B illustrates a plan view of the first package device 100 at the intermediate step illustrated in FIG. 5A in accordance with some embodiments, where the conductive lines 124 are not shown. In some embodiments, the first conductive pad 120 is laterally surrounded by the second conductive pads 122. The first conductive pad 120 and the second conductive pads 122 may have a shape such as a circular shape, an oval shape, a square shape, a rounded square shape, a rectangle shape, a rounded rectangle shape, a hexagon shape, a rounded hexagon shape, or a combination thereof, or the like. For example, as illustrated in FIG. 5B, the first conductive pad 120 may have a square-like shape, and the second conductive pads 122 may have a circle-like shape. The first conductive pad 120 may have a width $W_2$ of 100 μm to 5000 μm. The second conductive pads 122 may have a width $W_3$ of 6 μm to 200 μm. In some embodiments, the width $W_2$ of the first conductive pad 120 is 2 times to 200 times the width $W_3$ of the second conductive pads 122.

In some embodiments, the first conductive vias 116, the first conductive pad 120, the second conductive pads 122, and the conductive lines 124 are formed in a same process. For example, a seed layer 126 may be formed in the exposed openings 112 and extend on the top surface of the first substrate core 110A. A photoresist may be formed on the seed layer 126 and patterned to expose portions of the seed layer 126 which are included in the pattern of the first conductive pad 120, the second conductive pads 122 (e.g., including exposing the portions of the seed layer 126 in the openings 112), and the conductive lines 124. The seed layer 126 is a metal layer, which may be a single layer or a composite layer comprising a plurality of sub-layers formed of different materials. In some embodiments, the seed layer 126 comprises a titanium layer and a copper layer on the titanium layer. The seed layer 126 may be formed using, for example, PVD or the like. A plating process may be used to deposit a conductive material on the seed layer 126. The plated conductive material may include a metal material such as copper, tungsten, aluminum, an alloy thereof, a combination thereof, or the like. For example, the plated conductive material may be copper. Following the plating, the photoresist may be removed by an acceptable ashing or stripping process, such as using an oxygen plasma or the like. Then, the exposed portions of the seed layer 126 are removed. Removal of the seed layer 126 may be by an acceptable etching process, such as by wet or dry etching.

Figure 6:
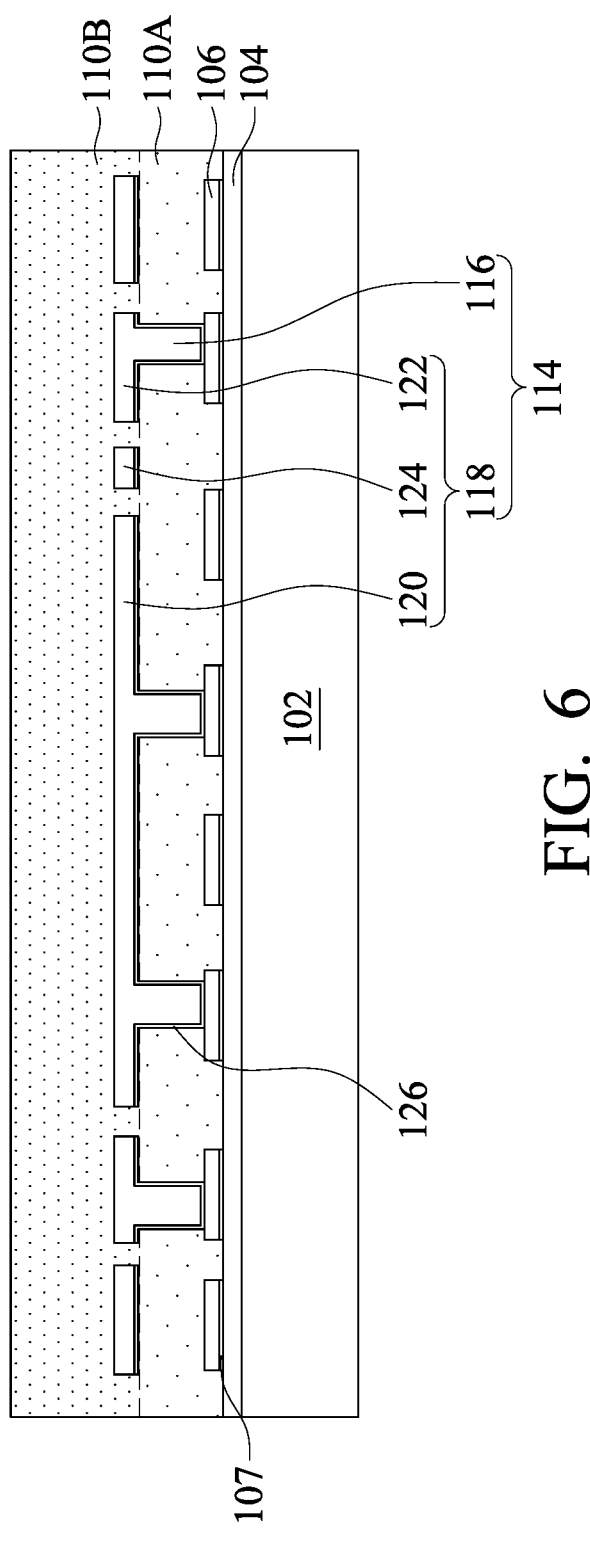

In FIG. 6, a second substrate core 110B is formed on the first substrate core 110A and the conductive layer 114 in accordance with some embodiments. The second substrate core 110B may be a same material as the first substrate core 110A and formed using the same or similar processes. In some embodiments, the second substrate core 110B has a material different from the material of the first substrate core 110A. As an example to form the second substrate core 110B, a material of the second substrate core 110B in a liquid or semi-liquid form is disposed on the first substrate core 110A and the conductive layer 114 and then cured by a thermal lamination process. In some embodiments, the second substrate core 110B has a thickness same as or similar to the thickness of the first substrate core 110A, though other thicknesses are contemplated and may be used. In some embodiments, the second conductive pattern 118 is embedded in the second substrate core 110B and has a bottom surface coplanar with a bottom surface of the second substrate core 110B.

Figure 7:
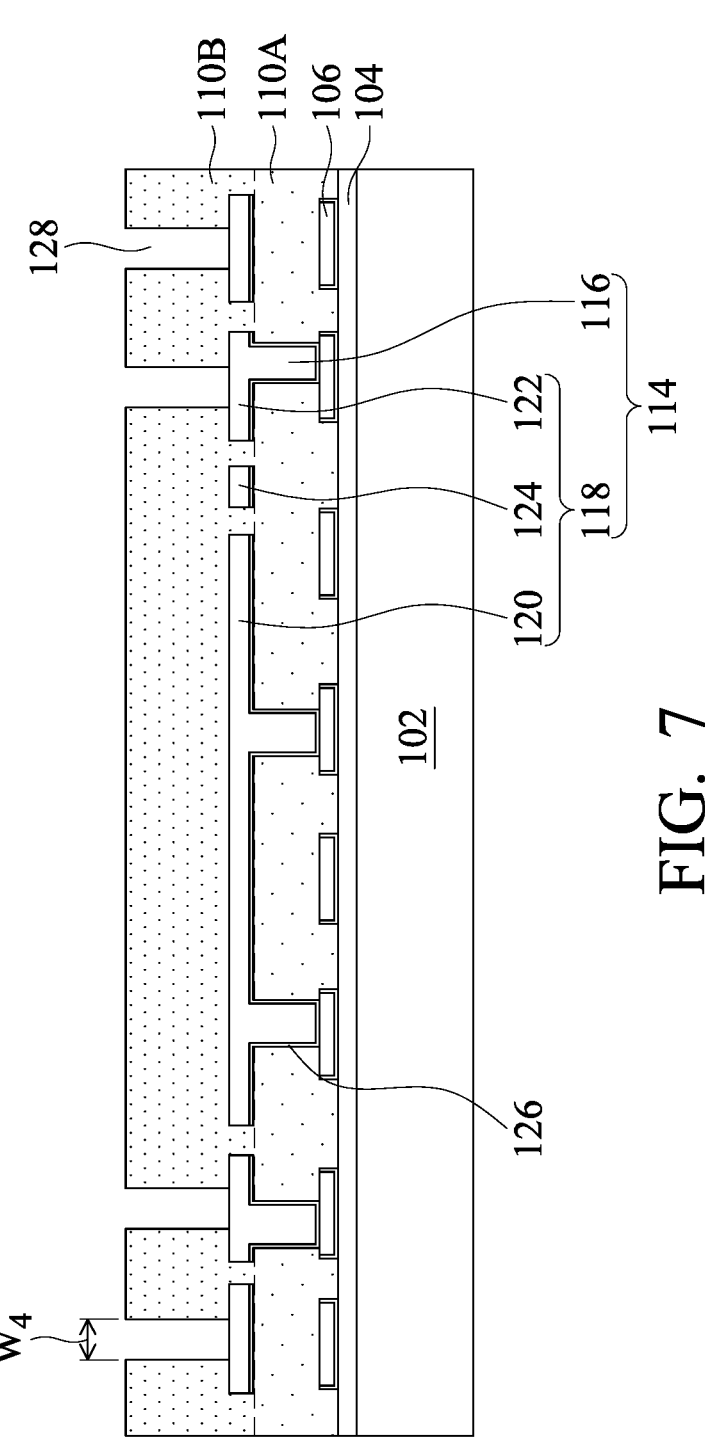

In FIG. 7, openings 128 are formed through the second substrate core 110B and expose the second conductive pads 122 in accordance with some embodiments. In some embodiments, the openings 128 are formed by laser drilling. Other processes, such as mechanical drilling with a drill bit, may also be used to form the openings 128. Any other suitable process may be used for forming the openings 128. The openings 128 may have any top-view shape, such as a polygon, a circle, or the like. A cleaning process may then be performed to clean areas near the openings 128 which may have been smeared with removed material of the second substrate core 110B. Openings 128 may have a width $W_4$ of 50 μm and 120 μm, such as 80 μm, though other values are contemplated and may be used. In some embodiments, openings 128 are formed in a regular pattern, having a pitch of 70 μm and 1000 μm, such as 150 μm, though other values are contemplated and may be used.

Figure 8:
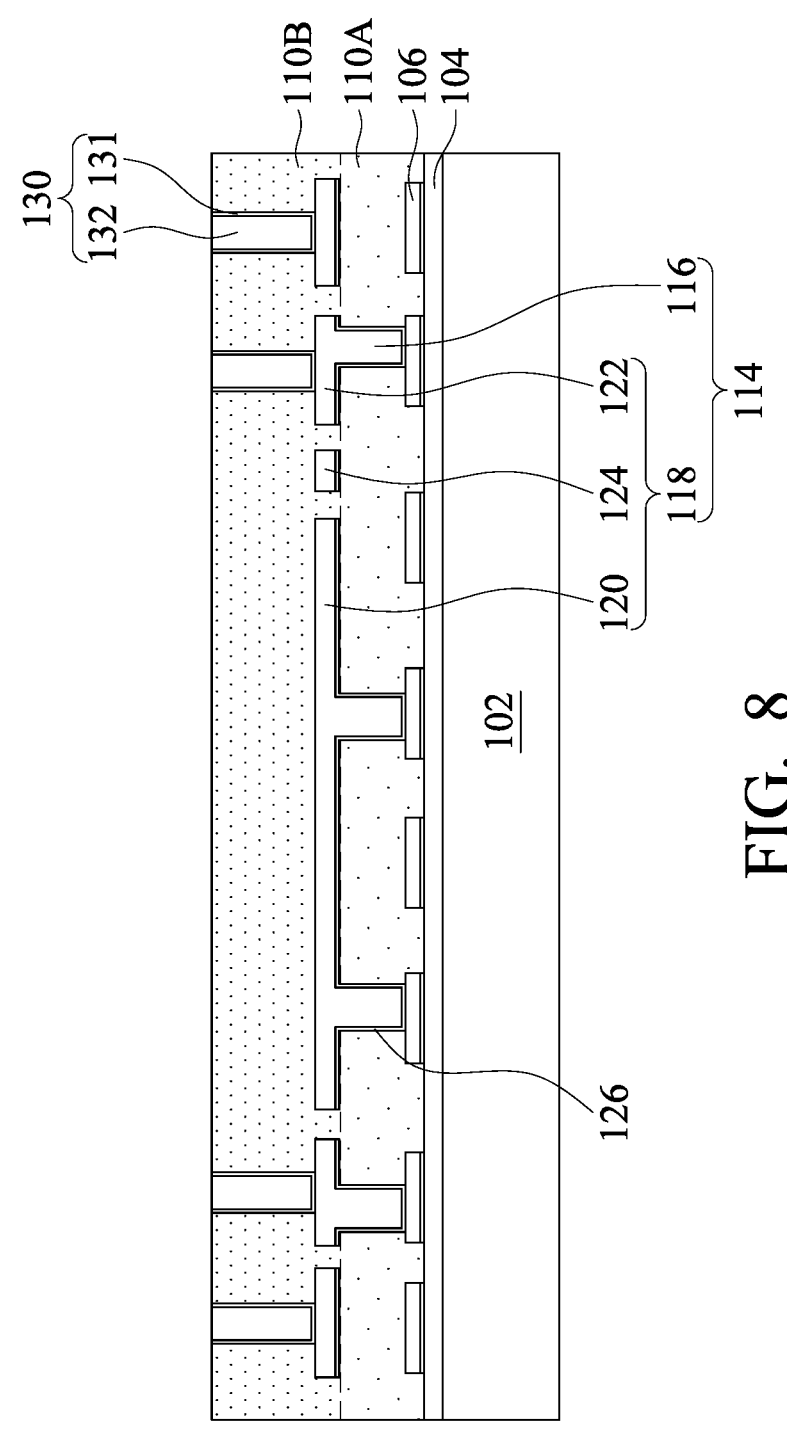

In FIG. 8, second conductive vias 130 are formed in the openings 128. In some embodiments, the second conductive vias 130 are formed by electroplating or electroless plating. For example, the second conductive vias may include a seed layer 131 and a conductive filling material 132 on the seed layer 131. The seed layer 131 may be deposited in the openings 128, such as deposited on the second conductive pads 122 and exposed sidewalls of the second substrate core 110B. In some embodiments, the seed layer 131 is a same material as the seed layer 117 and formed using the same or similar processes. A photoresist may be formed on the seed layer 131 and patterned to expose portions of the seed layer in the openings 128. A plating process may be used to deposit the conductive filling material 132 on the seed layer 131 and fill the openings 128 to form the second conductive vias 130 in the openings 128. The conductive filling material 132 may comprise a metal, like copper, tungsten, aluminum, a combination thereof, or the like. Following the plating, the photoresist may be removed by an acceptable ashing or stripping process, such as using an oxygen plasma or the like. Then, the exposed portions of the seed layer 131 are removed. Removal of the seed layer 131 may be by an acceptable etching process, such as by wet or dry etching. In some embodiments, a polish process, such as a mechanical grinding process, is performed to remove the excess conductive material on the second substrate core 110B.

Figure 9:
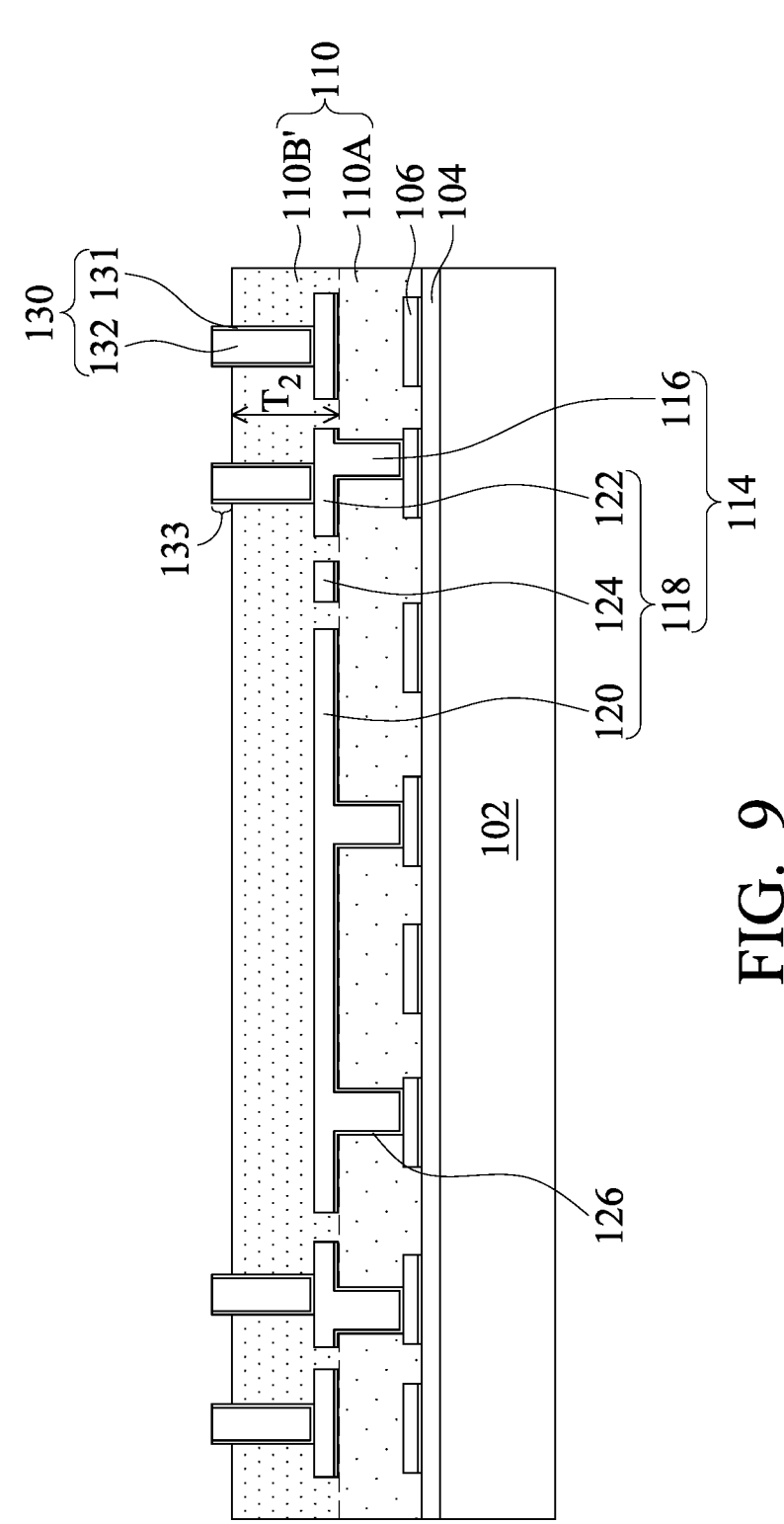

In FIG. 9, an etching process is performed to remove a portion of the second substrate core 110B in accordance with some embodiments. After the etching process, the second conductive vias 130 may include protrusions 133 protruding over the top surface of the remaining second substrate core 110B'. In some embodiments, the second substrate core 110B' has a thickness $T_2$ of about 10 μm to about 40 μm. The first substrate core 110A and the second substrate core 110B' may form and be collectively referred to as a substrate 110 of the first package device 100, where dies and redistribution structures may be disposed on the substrate 110. The etching process may include a dry etching such as a reactive-ion etching (RIE), or ion bombard or a wet etching using a solution of KOH, or a like.

Figure 10:
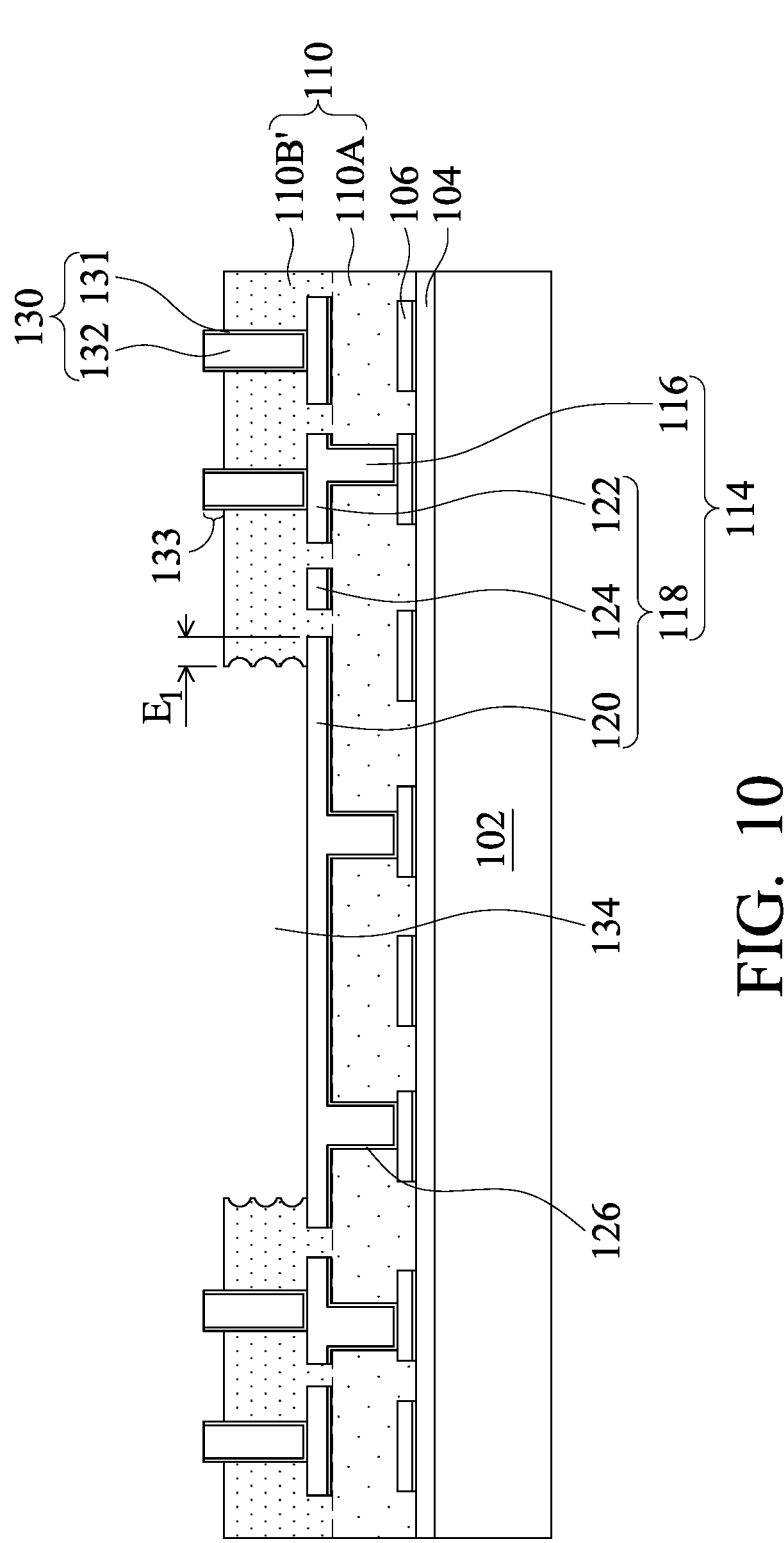

In FIG. 10, a cavity 134 is formed through the second substrate core 110B' and exposes the first conductive pad 120 in accordance with some embodiments. The cavity 134 may be formed by a laser drill process although other drilling processes such as a mechanical drill process may be used. In some embodiments, the first conductive pad 120 is used as a stopper for the laser drilling process. The edge boundaries of the cavity 134 may be within the first conductive pad 120 in a plan view. For example, as illustrated in FIG. 10, the first conductive pad 120 may comprise an edge portion E1 that horizontally extends beyond a sidewall of the cavity 134. The edge portion E1 of the first conductive pad 120 may have a length from 0 μm to 50 μm. The cavity 134 may have a plan-view shape such as a circular shape, an oval shape, a square shape, a rounded square shape, a rectangle shape, a rounded rectangle shape, a hexagon shape, a rounded hexagon shape, or a combination thereof, or the like. In some embodiments, the plan-view shape of the cavity 134 further has ripple-like edges burnt by laser pulses. In some embodiments, as illustrated in FIG. 10, the sidewall surfaces of the cavity 134 in a cross-view shape may also be roughened by the laser pulses of the laser drill process and include a plurality of recessed curved surfaces. For example, the average surface height deviation of the sidewalls of cavity 134 may be 0.2 um to 5 um. In some embodiments, the exposed portions of the first conductive pad 120 (e.g., portions exposed by the cavity 134) may have a surface roughness greater than that of the unexposed portions of the first conductive pad 120 (e.g., edge portions of the first conductive pad 120 covered by the second substrate core 110B'). The sidewalls of the cavity 134 are perpendicular to the bottom surface of the substrate core 110A, though the sidewalls of cavity 134 may be tilted from a surface perpendicular to the bottom surface of the substrate core 110A.

Figure 11:
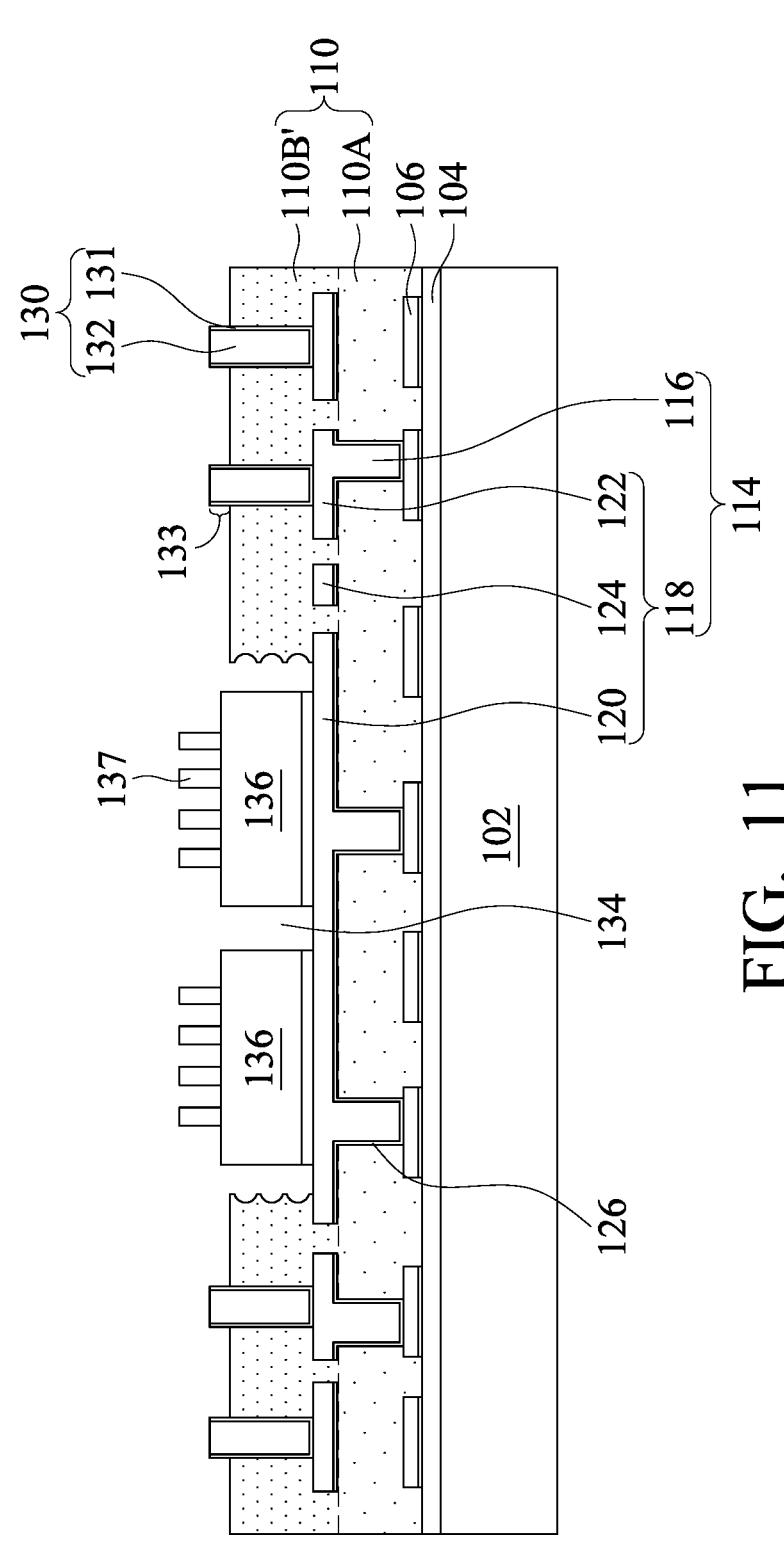

In FIG. 11, first dies 136 are disposed in the cavity 134 and on the first conductive pad 120 in accordance with some embodiments. Each of the first dies 136 may be a passive device such as an integrated passive device (IPD). The first dies 136 may include bond pads (not shown) such as aluminum pads to which external connections are made. The bond pads may be disposed on an active side of the first dies 136. The first dies 136 may also include die connectors 137. The die connectors 137 may be metal pillars physically and electrically formed on respective ones of the bond pads and electrically couple the respective passive features of the first dies 136. In some embodiments, the die connectors 137 are copper and formed by, for example, electroplating or the like. The die connectors 137 may be exposed although in some embodiments one or more passivation films may laterally encapsulate the die connectors 137. For example, the passivation film may include polyimide, poly(p-phenylene benzobisoxazole) (PBO), benzocyclobutene (BCB), a combination thereof, or the like. In some embodiments, the die connectors 137 of the first dies 136 protrude over the top surface of the second substrate core 110B'. In some embodiments, the die connectors 137 have a pitch of 10 μm to 40 μm.

An adhesive film 138 is disposed on the backsides of the first dies 136 (e.g., a side opposite the active side) and adheres the first dies 136 to the first conductive pad 120. The adhesive film 138 may be any suitable insulating adhesive, epoxy, die attach film (DAF), or the like. In some embodiments, the adhesive film 138 has a thickness of 5 μm to 20 μm. Although FIG. 11 illustrates two first dies 136, in some embodiments, more or less first dies 136 are disposed in the cavity 134.

Figure 12:
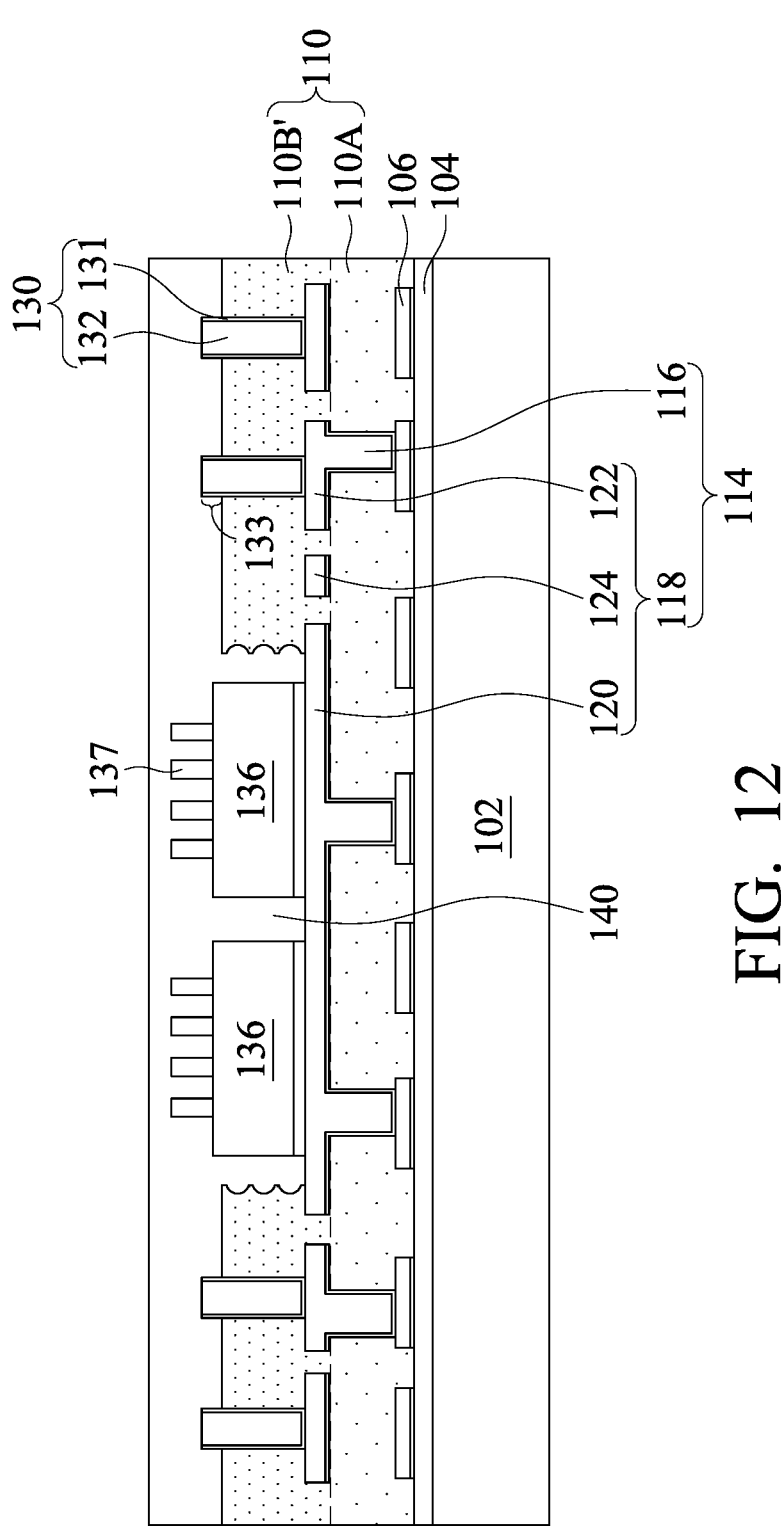

In FIG. 12, an encapsulant 140 is formed on and around various components. The encapsulant 140 fills the cavity 134 and buries the first dies 136 (including the die connectors 137) and the protrusions of the second conductive vias 130. As such, at least a portion of the encapsulant 140 is embedded in the second substrate core 110B and disposed on the first conductive pad 120. The first dies 136, including the die connectors 137, are disposed on the first conductive pad 120 and embedded in the encapsulant 140. The encapsulant 140 may be a molding compound, epoxy, or the like. The encapsulant 140 may be applied by compression molding, transfer molding, or the like.

Figure 13:
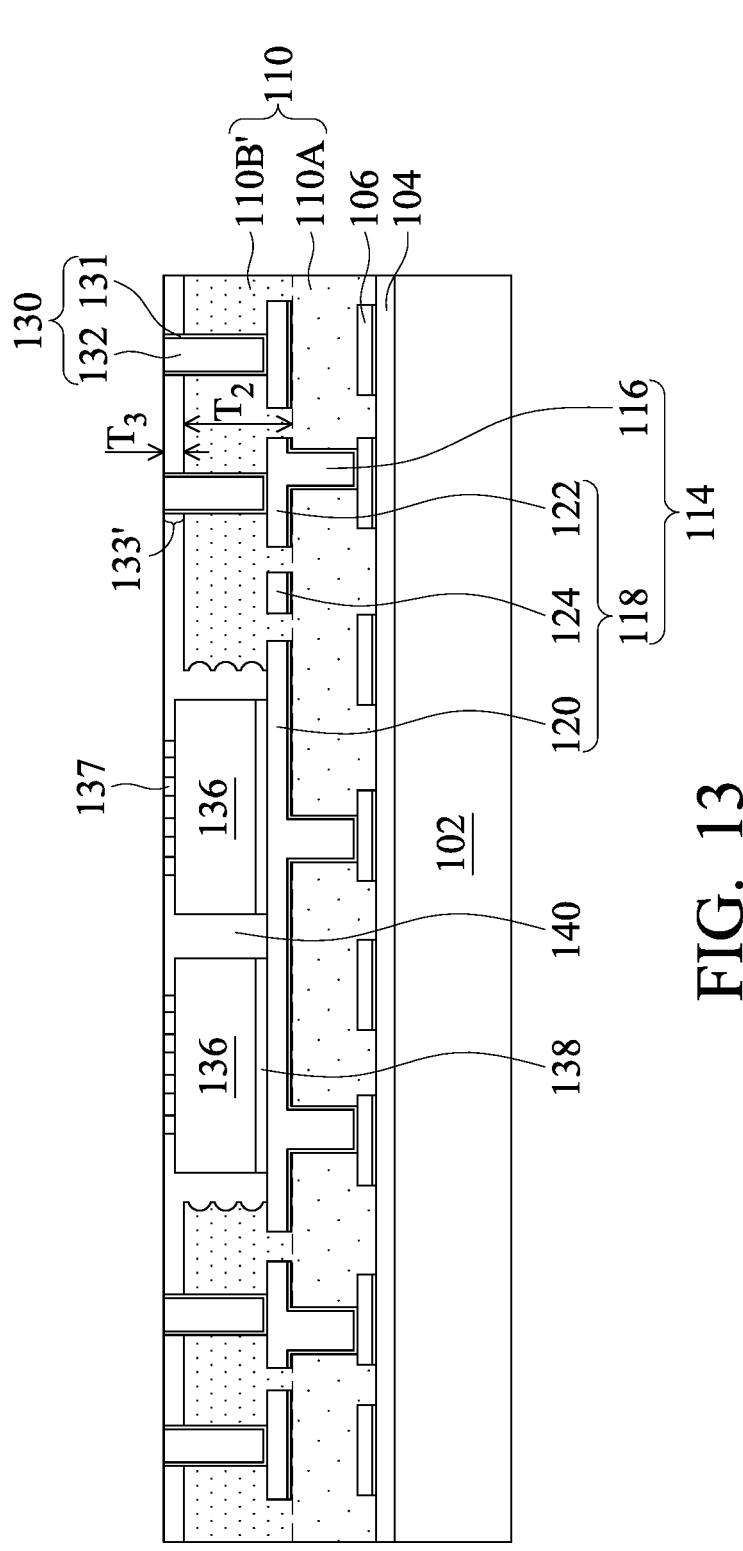

In FIG. 13, a planarization process is performed on the encapsulant 140 to expose the die connectors 137 of the first dies 136 and the second conductive vias 130. The planarization process may also remove materials of the encapsulant 140, the die connectors 137 of the first dies 136, and the second conductive vias 130 until the second conductive vias 130 and the die connectors 137 are both exposed. Top surfaces of the die connectors 137 of the first dies 136, the second conductive vias 130, and encapsulant 140 are substantially coplanar after the planarization process within process variations. The planarization process may be, for example, a chemical-mechanical polish (CMP), a grinding process, or the like. In some embodiments, the planarization is omitted, for example, if the second conductive vias 130 and the die connectors 137 are already exposed. In some embodiments, after the planarization, the remaining protrusion portions 133' of the second conductive vias 130 (e.g., protruding on the second substrate core 110B') have a thickness T3 of 0.5 µm to 10 µm, and which is 0.1 to 0.5 of the thickness T2 of the second substrate core 110B'.

Figure 14:
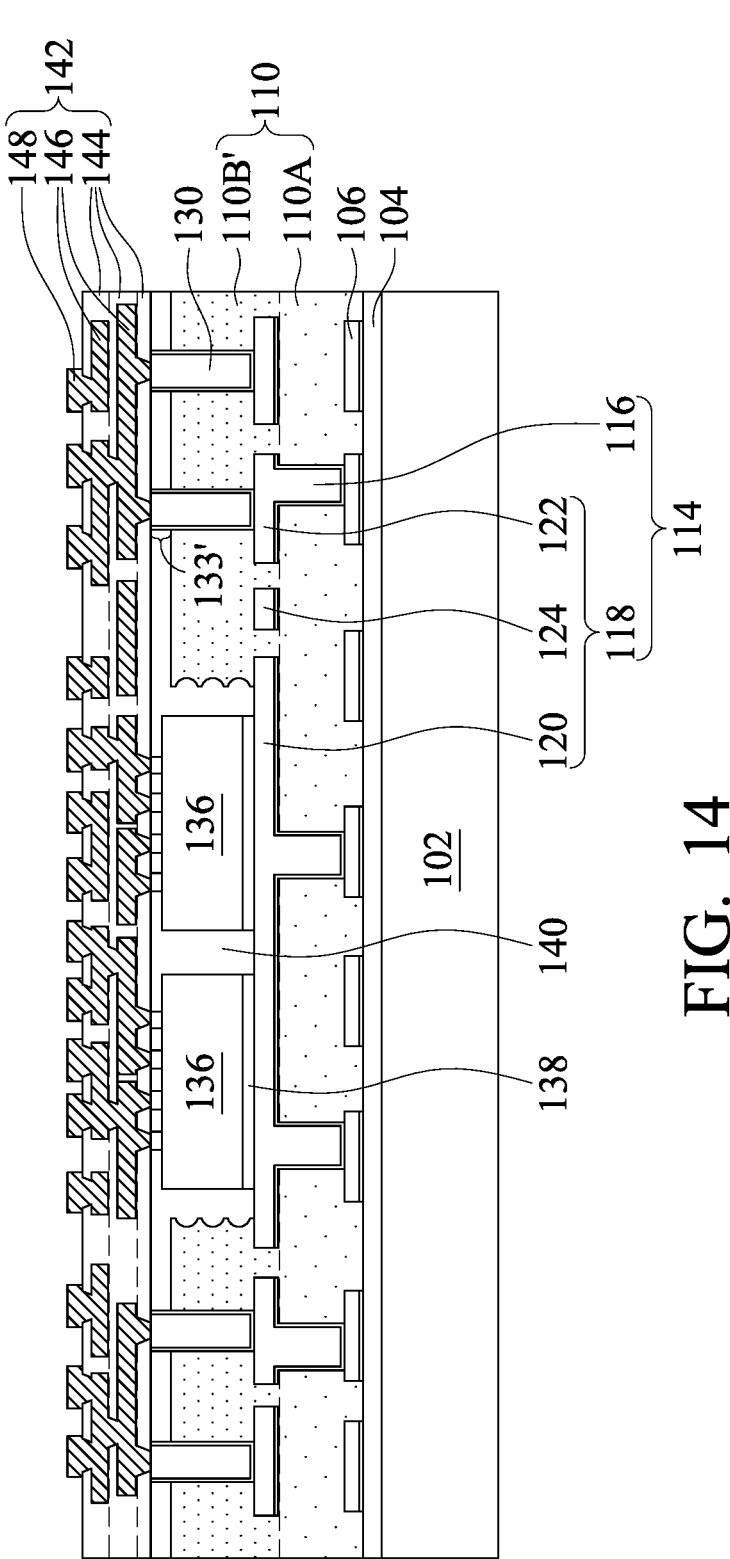

In FIG. 14, a redistribution structure 142 is formed on the coplanar top surfaces of the encapsulant 140, the second conductive vias 130, and the die connectors 137. The redistribution structure 142 may include one or more dielectric layers 144. For example, three dielectric layers 144 are illustrated in FIG. 14, though more or less dielectric layers may be contemplated and used. In some embodiments, the dielectric layers 144 are formed of a photo-sensitive material such as PBO, polyimide, BCB, or the like, which may be patterned using a lithography mask, such as exposing and developing the dielectric layers 144 to light when the dielectric layers 144 are a photo-sensitive material. The dielectric layers 144 may be formed by spin coating, lamination, CVD, the like, or a combination thereof. One or more layers of metallization pattern 146 is formed in the dielectric layers 144. The metallization pattern 146 may include conductive lines extending along a horizontal surface and vias extending through the dielectric layers 144. The metallization pattern 146 may physically and electrically couple to the second conductive vias 130 and the first dies 136. In some embodiments, the metallization pattern 146 is formed by plating and may include a seed layer (not shown) and a plated conductive material. The seed layer may be a metal layer, which may be a single layer or a composite layer comprising a plurality of sub-layers formed of different materials. In some embodiments, the seed layer comprises a titanium layer and a copper layer on the titanium layer. The seed layer may be formed using, for example, PVD or the like. The plated conductive material may comprise a metal, such as copper, tungsten, aluminum, or the like.

In some embodiments, the metallization pattern 148 is formed on the metallization pattern 146 and may include portions protruding on the top layer of the dielectric layers 144. The metallization pattern 148 may also include portions extending through the top layer of the dielectric layers 144 to physically and electrically couple the metallization pattern 146. The metallization pattern 148 may be formed in a similar manner and of a similar material as the metallization pattern 146. In some embodiments, the metallization pattern 148 has a different size than the metallization pattern 146. For example, the conductive lines and/or vias of the metallization pattern 148 may be wider or thicker than the conductive lines and/or vias of the metallization pattern 146. Further, the metallization pattern 148 may be formed to a greater pitch than the metallization pattern 146. The metallization pattern 148 may be under bump metallization (UBM) for external connection.

Figure 15:
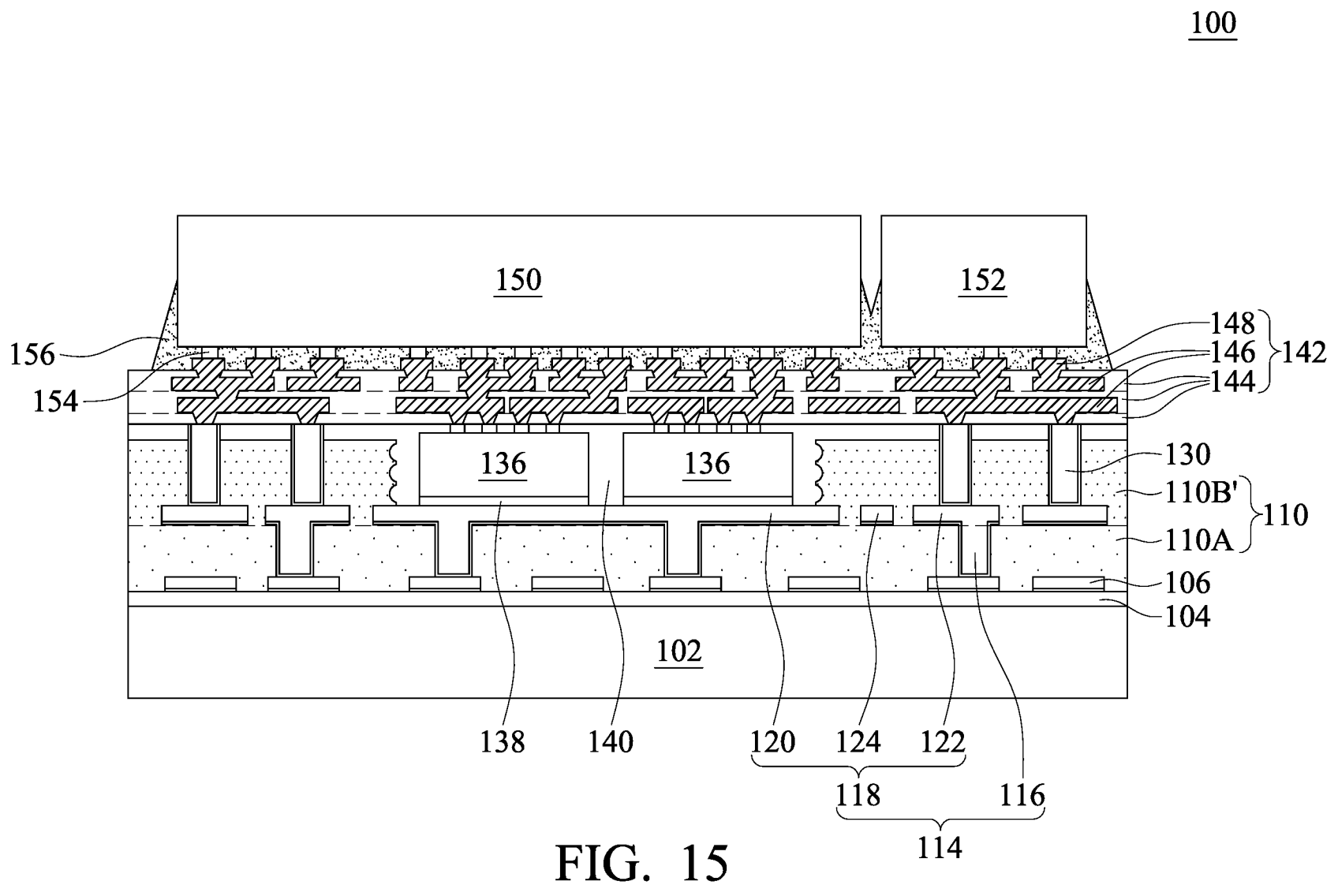

In FIG. 15, at least one second die 150 and at least one third die 152 are disposed on the metallization patterns 148. The second die 150 and the third die 152 may be integrated circuited dies. For example, the second die 150 may be a logic device, such as a central processing unit (CPU), graphics processing unit (GPU), system-on-a-chip (SoC), microcontroller, or the like. The third die 152 may be a memory device, such as a dynamic random access memory (DRAM) die, static random access memory (SRAM) die, hybrid memory cube (HMC) module, a high bandwidth memory (HBM) module, or the like. In some embodiments, the second die 150 and the third die 152 are the same type of dies, such as SoC dies. The second die 150 and third die 152 may be formed in processes of a same technology node, or may be formed in processes of different technology nodes. For example, the second die 150 may be made of a more advanced process node than the third die 152. The second die 150 and the third die 152 may have different sizes (e.g., different heights and/or surface areas). In some embodiments, the second die 150 is disposed at a position overlapping the first dies 136 or the second conductive pad 122 in a plan view, which may reduce the signal transmitting routes between the first dies 136 and the second die 150 for improved performance. In some embodiments, the boundaries of the cavity 134 are within the boundaries of the second die 150 in a plan view.

In some embodiments, the second die 150 and the third die 152 are bonded to the metallization pattern 148 by conductive connectors 154. The conductive connectors 154 may be metal pillars, controlled collapse chip connection (C4) bumps, micro solder bumps, electroless nickel-electroless palladium-immersion gold technique (ENEPIG) formed bumps, or the like. The conductive connectors 154 may include a conductive material such as solder, copper, aluminum, gold, nickel, silver, palladium, tin, the like, or a combination thereof. Once a layer of solder has been formed on the structure, a reflow may be performed in order to shape the material into the desired bump shapes. In some embodiments, the conductive connectors 154 comprise metal pillars (such as a copper pillar) formed by a sputtering, printing, electroplating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, an underfill 156 is formed between the second die 150 and the redistribution structure 142 and between the third die 152 and the redistribution structure 142, surrounding the conductive connectors 154. The underfill 156 may reduce stress and protect the joints resulting from the reflowing of the conductive connectors 154. The underfill 156 may be formed by a capillary flow process after the second die 150 and the third die 152 are attached to the metallization pattern 148.

Figure 16:
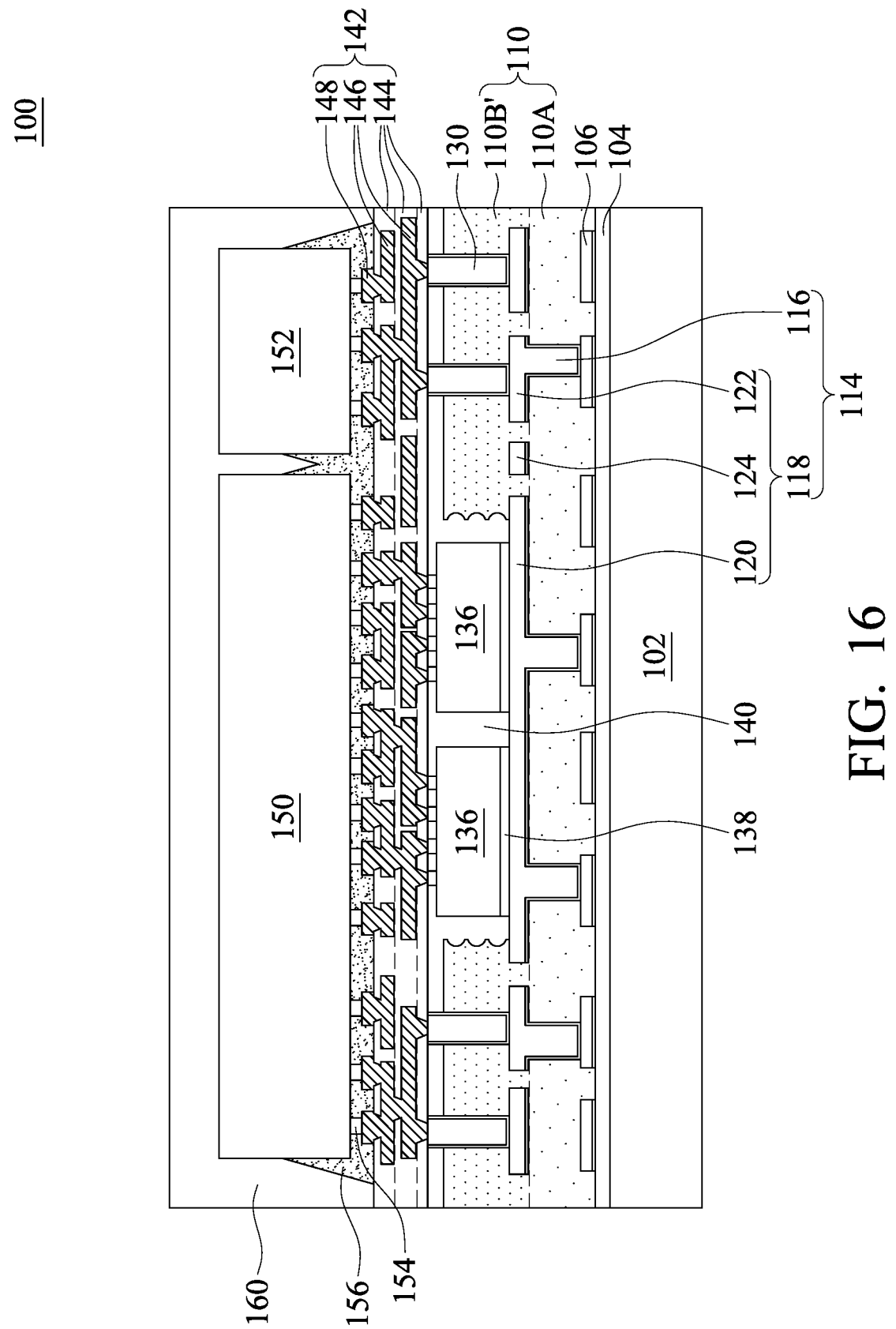
Figure 17:
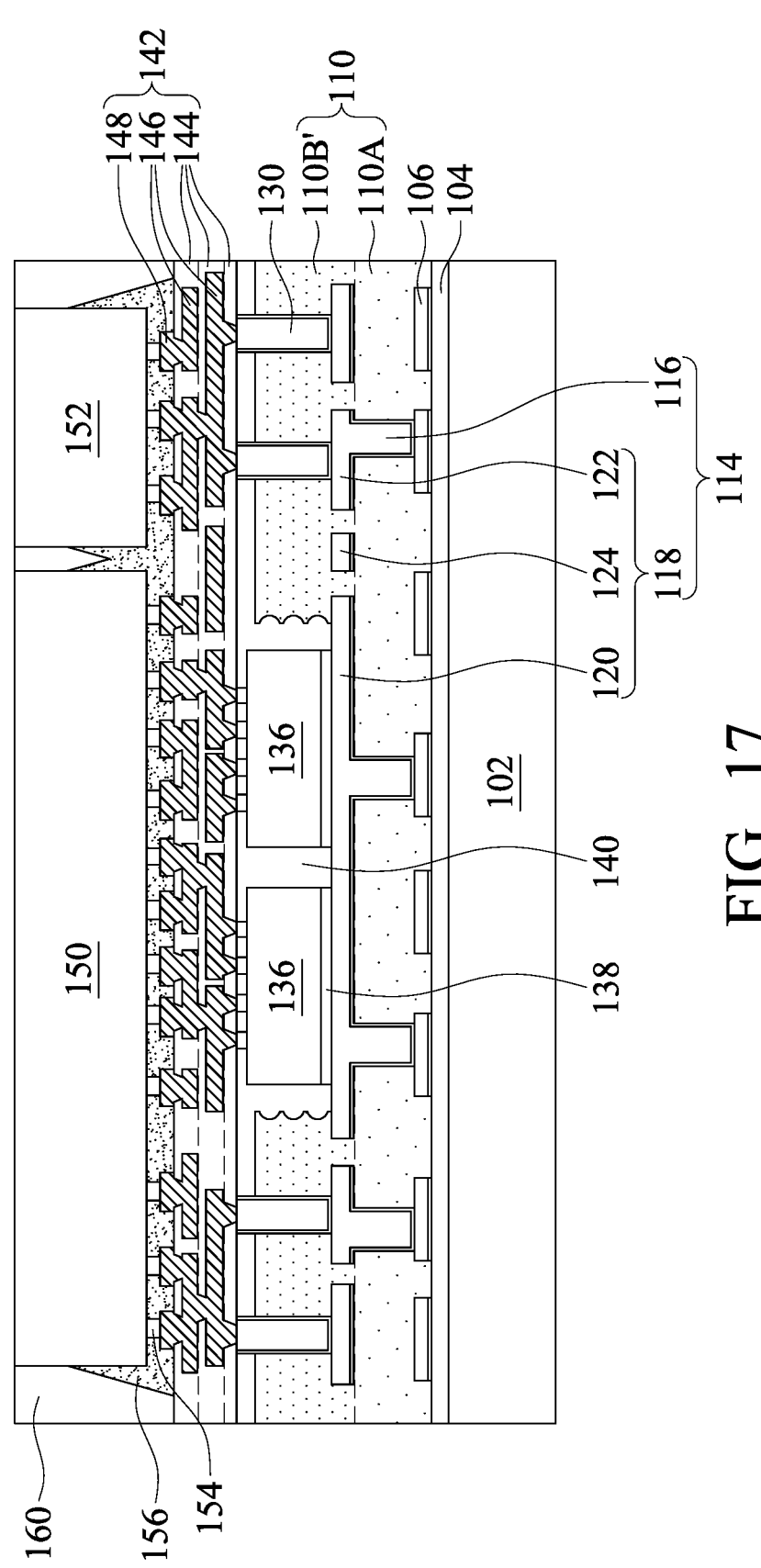

In FIG. 16, an encapsulant 160 is formed on and bury the second die 150, the third die 152, and the underfill 156. The encapsulant 160 may be a molding compound, epoxy, or the like. The encapsulant 160 may be applied by compression molding, transfer molding, or the like. In FIG. 17, a planarization process may be performed to remove a portion of the encapsulant 160. In some embodiments, at least a portion of the second die 150 (or at least a portion of the third die if the height of the third die is greater than that of the second die) is removed, and the encapsulant 160, the second die 150, and the third die 152 may have coplanar top surfaces. The planarization process may be omitted if the second die 150 and the third die 152 are already exposed in accordance with some embodiments.

Figure 18:
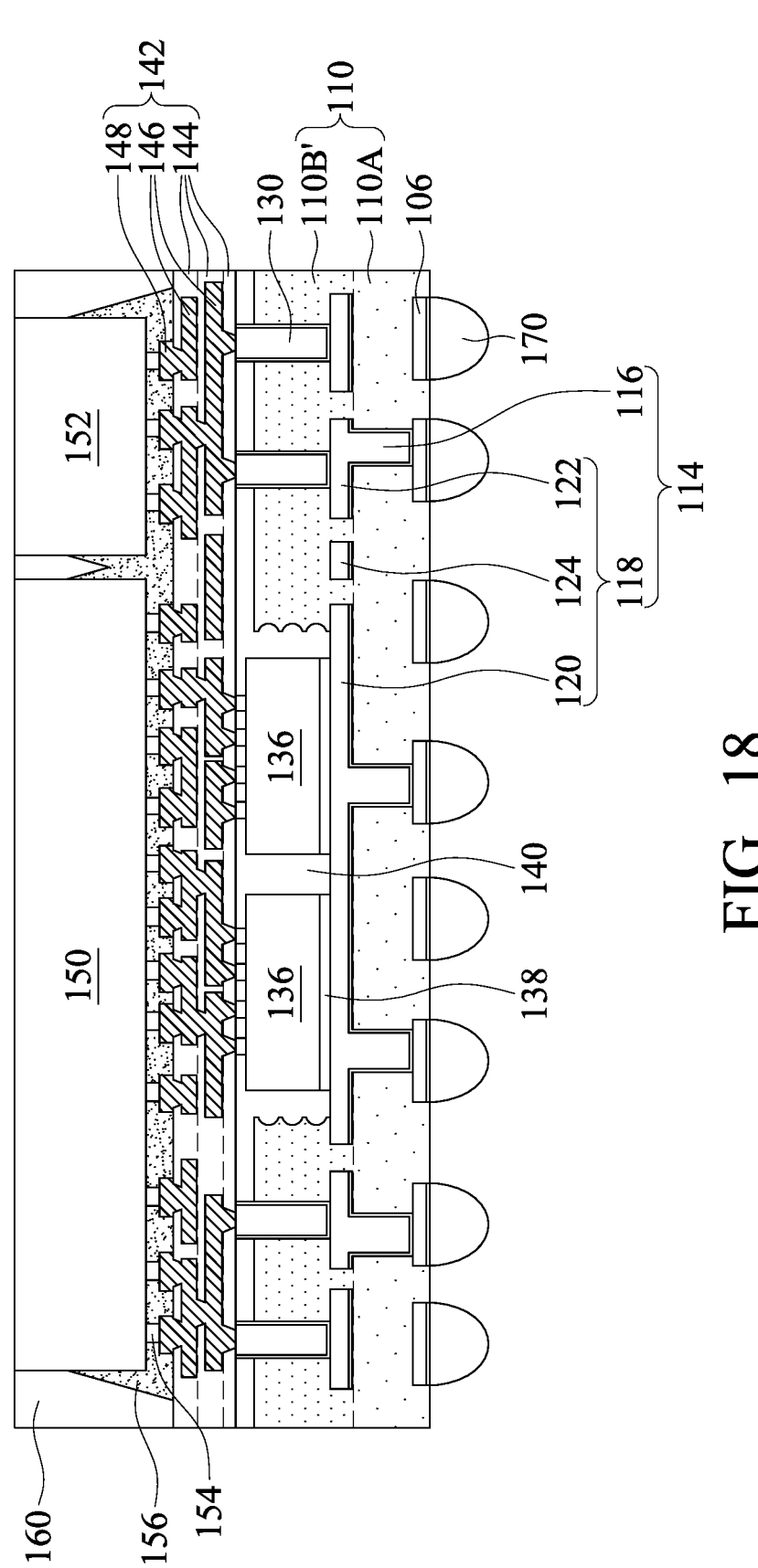

In FIG. 18, in some embodiments, the carrier substrate de-bonding is performed to detach (or "de-bond") the carrier substrate 102 from the first substrate core 110A. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown). Conductive connectors 170 are formed on the first conductive pattern 106. In some embodiments, the conductive connectors 170 are ball grid array (BGA) connectors, solder balls, controlled collapse chip connection (C4) bumps, micro bumps, electroless nickel-electroless palladium-immersion gold technique (ENEPIG) formed bumps, or the like. In some embodiments, the conductive connectors 170 are formed by initially forming a layer of solder through evaporation, electroplating, printing, solder transfer, ball placement, or the like. The conductive connectors 170 may have a width and pitches greater than that of the conductive connectors 154. Until now, a plurality of first package devices 100 (only one is shown in the illustrated Figures) is formed on the carrier substrate 102 (e.g., a carrier wafer) in a wafer form, and a singulation process may be performed to saw the wafer to separate these first package devices 100. For example, a plurality of singulated first package devices 100 as illustrated in FIG. 18, which are identical to each other, is obtained.

Figure 19:
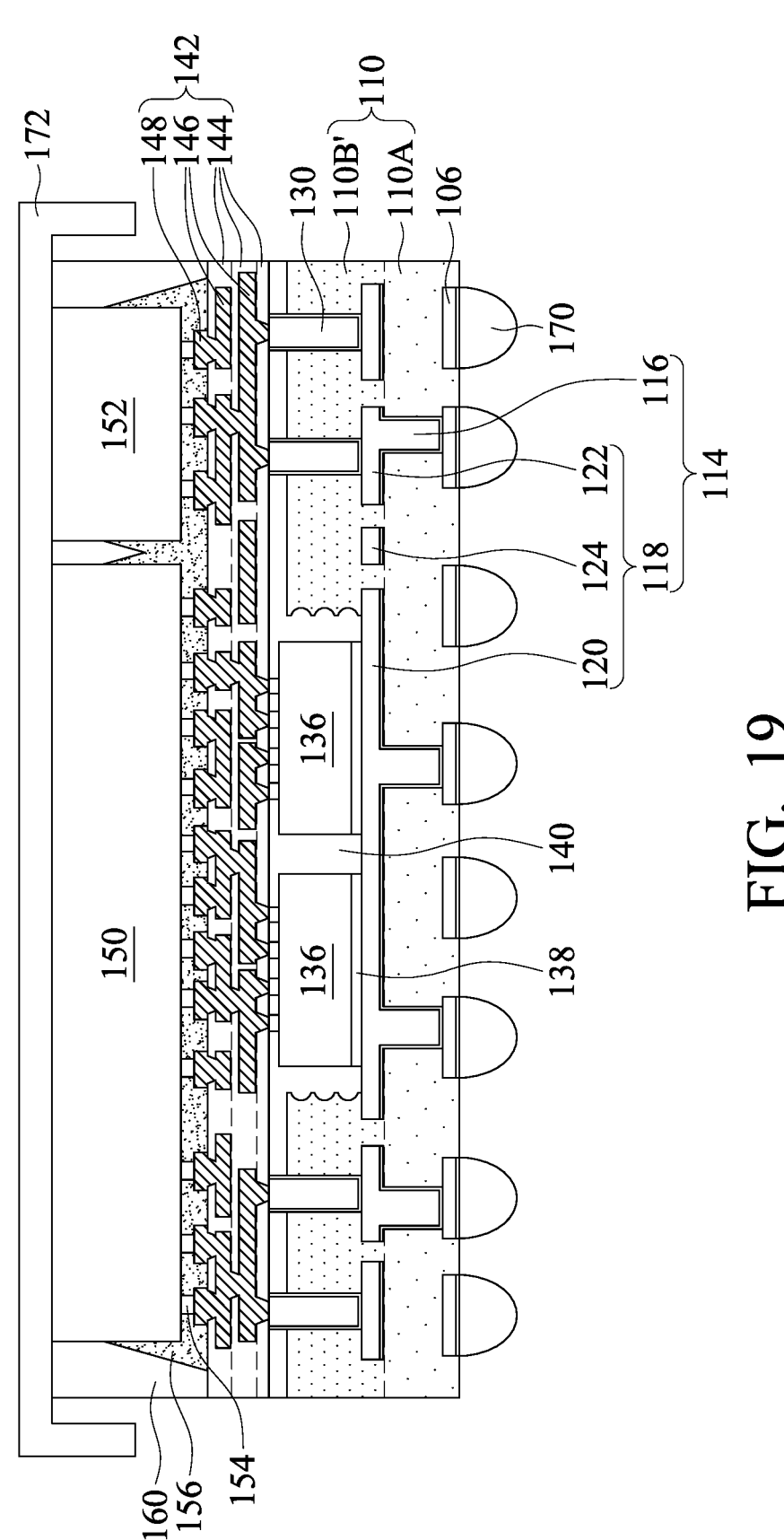

In FIG. 19, in some embodiments, a protection lid 172 is disposed on the singulated first package devices 100, such as disposed on the second die 150 and the third die 152 for protecting and dissipating heat from the second die 150 and the third die 152. The protection lid 172 may comprise copper or aluminum. The protection lid 172 may be attached to the singulated first package devices 100 using an adhesive, such as a thermal interface material (not shown).

In accordance with the embodiments as illustrated above, the first dies 136 are disposed in the cavity 134 for reducing the overall package height. The first dies 136 comprise the die connectors 137 and are surrounded by the second conductive vias 130. As such, coplanar top surfaces of the die connectors 137 and the second conductive vias 130 may be provided, and the redistribution structure 142 may be directly formed thereon and bonded to the die connectors 137 and the second conductive vias 130, without forming other conductive connectors therebetween. The signal transmitting routes between the first dies 136 and the second die 150 may be shortened, thereby improving the package performance. In some embodiments, the etched second substrate core 110B' allows the encapsulant 140 to extend between the redistribution structure 142 and the second substrate core 110B', which may reduce the overall warpage of the first package device 100.

In some embodiments, a second package device 200, as illustrated in Figure is provided. The second package device 200 may be similar to the first package device 100 and with the first conductive pad 220 having a plurality of holes filled with protrusions 110B$_1$ of the second substrate core 110B'. In some embodiments, the first conductive pad 220 may be formed of the same material as the first conductive pad 120. The first conductive pad 220 may be formed using the same processes as the first conductive pad 120, where the photoresist on the seed layer 126 exposes a pattern corresponding to the pattern of the first conductive pad 220. Accordingly, holes are formed in the first conductive pad 220, and these holes are filled with the protrusions 110B$_1$ when forming the second substrate core 110B. The first conductive pad 220 may have the same width and outer shape as the first conductive pad 120. Each of the holes may have a width of 5 um to 100 um. In some embodiments, to have the holes filled with protrusions 110B$_1$ of the second substrate core 110B' in the first conductive pad 220 may reduce the overall warpage of the first conductive pad 220.

Figure 20:
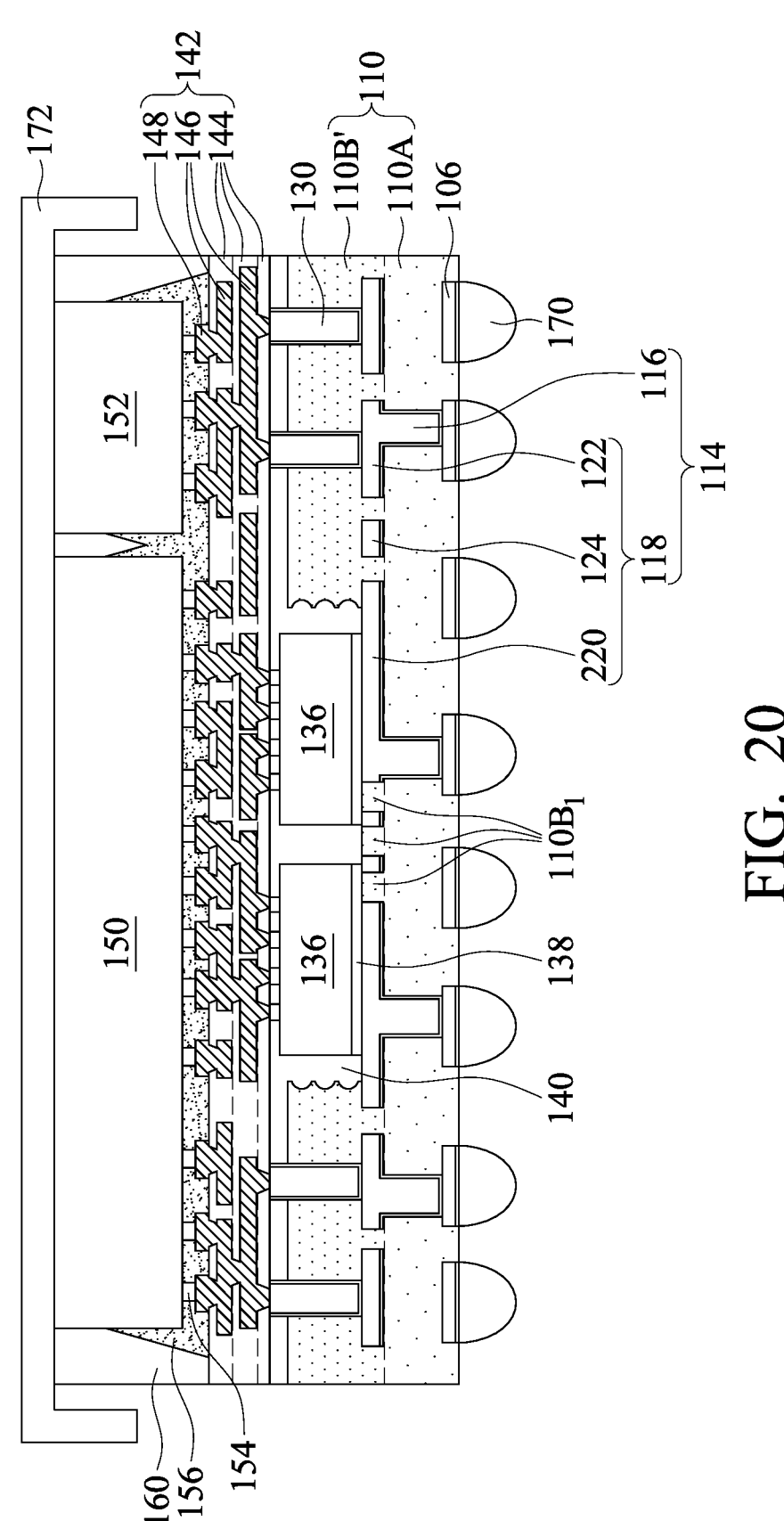
Figure 21:
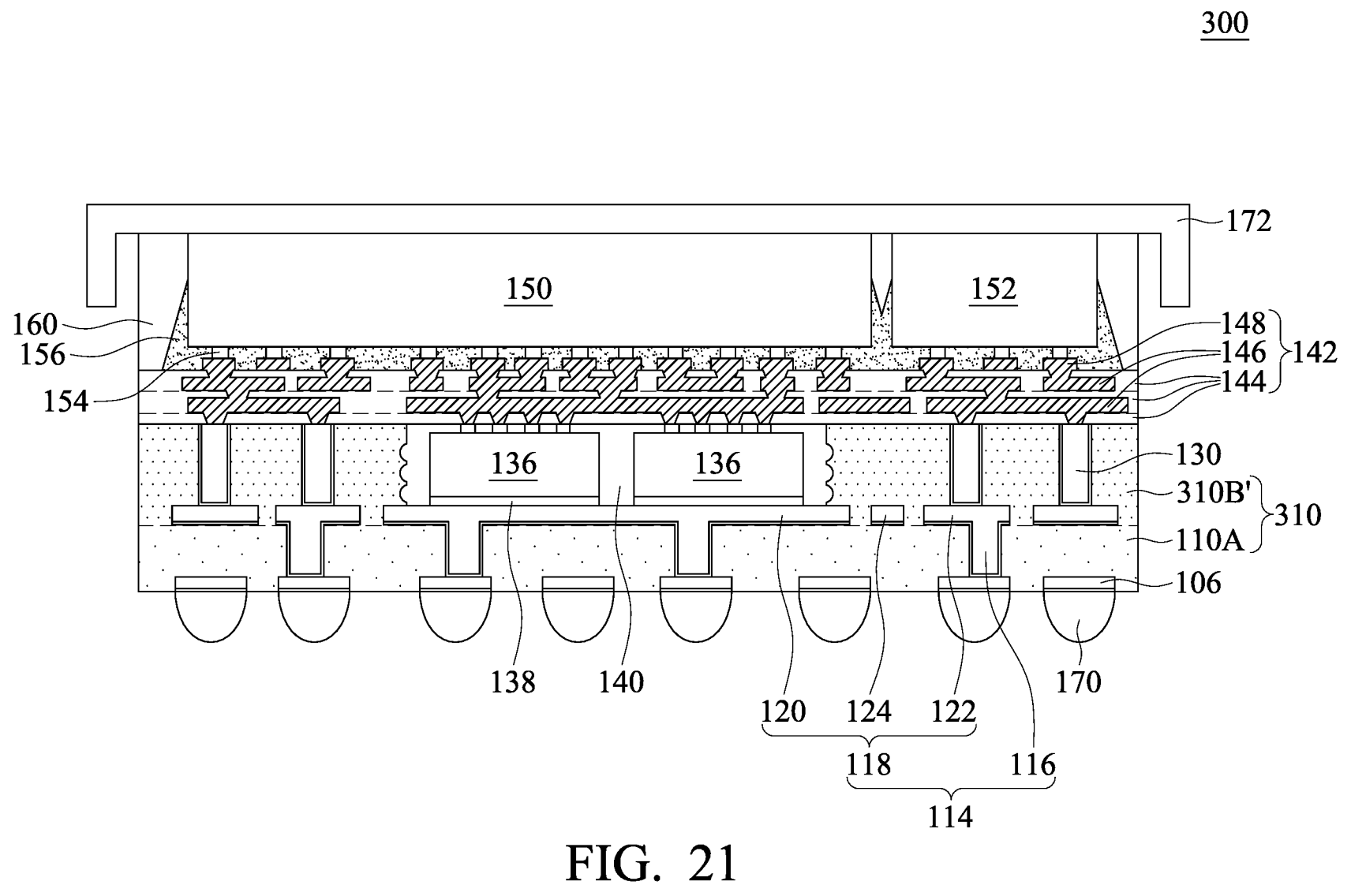

In some embodiments, a third package device 300, as illustrated in FIG. 21, is provided in accordance with some embodiments. The third package device 300 may be similar to the first package device 100 and with the redistribution structure 142 in physical contact with the second substrate core 310B'. The formation of the third package device 300 may be the same as the process of forming the first package device 100, where the etching of the second substrate core 110B as illustrated in FIG. 9 is omitted. As such, the second conductive via 130 is not protruded over the second substrate core 110B at that stage, and the planarization process as illustrated in FIG. 13 removes materials of die connectors 137 of the first dies 136, the encapsulant 140, and the second conductive vias 130, and removes a portion of the second substrate core 110B to form a second substrate core 310B'. The first substrate core 110A and the second substrate core 310B' may form a substrate 310 of the third package device 300. The remaining portions of the die connectors 137 of the first die 136, the encapsulant 140, and the second conductive vias 130, and the second substrate core 310B' may have coplanar top surfaces after the planarization process. The redistribution structure 142 is directly formed on the coplanar surfaces (e.g., in physical contact with the second substrate core 310B'). In some embodiments, the first conductive pad 120 does not have openings formed therein, but in some embodiments, the first conductive pad 120 of the third package device 300 may include protrusions 110B$_1$ as illustrated in FIG. 20 to reduce the overall warpage of the first conductive pad 120.

In an embodiment, a package, including a substrate including a first conductive via embedded in a first substrate core; a conductive pattern disposed on the first substrate core, wherein the conductive pattern includes a first conductive pad and a second conductive pad; a second substrate core disposed on the first substrate core and the conductive pattern; and a second conductive via disposed in the second substrate core and on the second conductive pad; an encapsulant embedded in the second substrate core and in physical contact with the first conductive pad; a first die, including die connectors, embedded in the encapsulant and disposed on the first conductive pad, wherein top surfaces of the second conductive via, the die connectors, and the encapsulant are coplanar; a redistribution structure disposed on the second conductive via, the die connectors and the encapsulant; and a second die disposed on the redistribution structure. In an embodiment, the second conductive via includes a protrusion extending over the second substrate core. In an embodiment, the encapsulant extends over the second substrate core and laterally encapsulates the protrusion of the second conductive via. In an embodiment, the first die is disposed on the first conductive pad via an adhesive film. In an embodiment, a top surface of the first conductive pad includes a first portion in physical contact with the encapsulant and a second portion in physical contact with the second substrate core. In an embodiment, the first portion of the top surface of the first conductive pad has a greater surface roughness than that of the second portion of the top surface of the first conductive pad. In an embodiment, the second substrate core includes a protrusion laterally surrounded by the first conductive pad. In an embodiment, the package further includes a third die disposed on the redistribution structure, wherein the second die overlaps the first die in a plan view, and the third die offsets from the first die in the plan view. In an embodiment, the first die is a passive device die, and the second die is a logic device die.

In an embodiment, a package, including a substrate including a substrate core; a first conductive pattern disposed in the substrate core; a conductive layer including a plurality of first conductive vias disposed in the substrate core and on the first conductive pattern; and a second conductive pattern including a first conductive pad and a plurality of second conductive pads disposed at a same level, wherein the second conductive pads are disposed in the substrate core and in physical contact with the first conductive vias; and a plurality of second conductive vias disposed in the substrate core and on the second conductive pads; an encapsulant disposed on the first conductive pad and including at least a portion laterally surrounded by the substrate core; a first die disposed in the encapsulant and disposed on the first conductive pad; a redistribution structure disposed on the encapsulant and the substrate and including a conductive material in physical contact with the first die and the second conductive vias; and a second die disposed on the redistribution structure. In an embodiment, the portion of the encapsulation laterally surrounded by the substrate core has a sidewall, wherein an average surface height deviation of the sidewall is 0.2 um to 5 um. In an embodiment, all the first conductive vias offset from the first conductive pad in a plan view. In an embodiment, the encapsulant extends over a top surface of the substrate core and laterally encapsulates the second vias. In an embodiment, the conductive layer includes a seed layer continuously extending from at least one of the first conductive vias to at least one of the second conductive pads. In an embodiment, the substrate core includes a portion penetrating through the first conductive pad.

In an embodiment, a method of manufacturing a package, the method including forming a first substrate core; forming a conductive layer including a first conductive via penetrating through the first substrate core; a first conductive pad disposed on the first substrate core; and a second conductive pad disposed on the first substrate core and in physical contact with the first conductive via; forming a second substrate core on the conductive layer and the first substrate core; forming a second conductive via penetrating the second substrate core and in physical contact with the second conductive pad; forming a cavity in the second substrate core and exposing the first conductive pad; disposing a first die including die connectors on the first conductive pad; forming an encapsulant filling the cavity and laterally encapsulating the first die; forming a redistribution structure on the first die, the encapsulant, and the second conductive via; and disposing a second die on the redistribution structure. In an embodiment, the method further includes forming a protrusion of the second conductive via by etching a portion of the second substrate core before forming the encapsulant. In an embodiment, the first die includes a die connector at a side facing away from the first conductive pad, and the method further includes a planarization process removing a portion of the encapsulant, a portion of the die connectors, and a portion of the protrusion of the second conductive via before forming the redistribution structure. In an embodiment, the first die includes a die connector at a side facing away from the first conductive pad, and the method further includes a planarization process removing a portion of the encapsulant, a portion of the die connectors, a portion of the second substrate core, and a portion of the second conductive via before forming the redistribution structure. In an embodiment, forming the cavity includes drilling the second substrate core by a laser using the first conductive pad as a stopper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a substrate comprising:
       a first conductive via embedded in a first substrate core;
       a conductive pattern disposed on the first substrate core, wherein the conductive pattern comprises a first conductive pad and a second conductive pad;
       a second substrate core disposed on the first substrate core and the conductive pattern, wherein the second substrate core comprises a protrusion laterally surrounded by the first conductive pad; and
       a second conductive via disposed in the second substrate core and on the second conductive pad;
   an encapsulant embedded in the second substrate core and in physical contact with the first conductive pad;
   a first die, comprising die connectors, embedded in the encapsulant and disposed on the first conductive pad, wherein top surfaces of the second conductive via, the die connectors, and the encapsulant are coplanar;
   a redistribution structure disposed on the second conductive via, the die connectors and the encapsulant; and
   a second die disposed on the redistribution structure.

2. The package of claim 1, wherein the second conductive via comprises a protrusion extending over the second substrate core.

3. The package of claim 2, wherein the encapsulant extends over the second substrate core and laterally encapsulates the protrusion of the second conductive via.

4. The package of claim 1, wherein the first die is disposed on the first conductive pad via an adhesive film.

5. The package of claim 1, wherein a top surface of the first conductive pad comprises a first portion in physical contact with the encapsulant and a second portion in physical contact with the second substrate core.

6. The package of claim 5, wherein the first portion of the top surface of the first conductive pad has a greater surface roughness than that of the second portion of the top surface of the first conductive pad.

7. The package of claim 1, wherein the second substrate core and the encapsulant form an interface, and further wherein the interface forms a plurality of recessed curved surfaces.

8. The package of claim 1, further comprising a third die disposed on the redistribution structure, wherein the second die overlaps the first die in a plan view, and the third die offsets from the first die in the plan view.

9. The package of claim 1, wherein the first die is a passive device die, and the second die is a logic device die.

10. A package, comprising:
a substrate comprising:
a substrate core;
a first conductive pattern disposed in the substrate core;
a conductive layer comprising:
a plurality of first conductive vias disposed in the substrate core and on the first conductive pattern; and
a second conductive pattern comprising a first conductive pad and a plurality of second conductive pads disposed at a same level, wherein the second conductive pads are disposed in the substrate core and in physical contact with the first conductive vias, wherein the substrate core comprises a portion penetrating through the first conductive pad; and
a plurality of second conductive vias disposed in the substrate core and on the second conductive pads;
an encapsulant disposed on the first conductive pad and comprising at least a portion laterally surrounded by the substrate core;
a first die disposed in the encapsulant and disposed on the first conductive pad;
a redistribution structure disposed on the encapsulant and the substrate and comprising a conductive material in physical contact with the first die and the second conductive vias; and
a second die disposed on the redistribution structure.

11. The package of claim 10, wherein the portion of the encapsulant laterally surrounded by the substrate core has a sidewall, wherein an average surface height deviation of the sidewall is 0.2 μm to 5 μm.

12. The package of claim 10, wherein all the first conductive vias offset from the first conductive pad in a plan view.

13. The package of claim 10, wherein the encapsulant extends over a top surface of the substrate core and laterally encapsulates the second conductive vias.

14. The package of claim 10, wherein the conductive layer comprises a seed layer continuously extending from at least one of the first conductive vias to at least one of the second conductive pads.

15. The package of claim 10, wherein the substrate core comprises a first substrate core sublayer of a first thickness and a second substrate core sublayer of the first thickness.

16. A package, comprising:
a first substrate core;
a conductive layer comprising:
a first conductive via penetrating through the first substrate core;
a first conductive pad disposed on the first substrate core, wherein the first conductive pad comprises a plurality of pad segments; and
a second conductive pad disposed on the first substrate core and in physical contact with the first conductive via;
a second substrate core on the conductive layer and the first substrate core, the second substrate core extending below a topmost surface of the first conductive pad and being interjacent respective pad segments of the plurality of pad segments;
a second conductive via penetrating the second substrate core and in physical contact with the second conductive pad;
a cavity in the second substrate core, wherein the first conductive pad is on a floor of the cavity;
a first die within the cavity and on the first conductive pad, the first die comprising a die connector;
an encapsulant laterally encapsulating the first die;
a redistribution structure on the first die, the encapsulant, and the second conductive via; and
a second die on the redistribution structure.

17. The package of claim 16, further comprising a protrusion of the second conductive via extending above the second substrate core.

18. The package of claim 16, wherein the die connector is at a side of the first die facing away from the first conductive pad.

19. The package of claim 16, wherein the encapsulant extends over a top surface of the first substrate core and laterally encapsulates the second conductive via.

20. The package of claim 16, wherein a top surface of the first conductive pad comprises a first portion in physical contact with the encapsulant and a second portion in physical contact with the second substrate core.

* * * * *